(12) United States Patent
Cabrera et al.

(10) Patent No.: US 7,458,860 B2
(45) Date of Patent: Dec. 2, 2008

(54) INTERNAL POWER BUS AND POWER OUTPUT ASSEMBLY

(75) Inventors: Carlos Cabrera, Ciudad Juarez (MX); Sergio Cardoza, Ciudad Juarez (MX)

(73) Assignee: ADC Telecommunications, Inc., Eden Prairie, MN (US)

( * ) Notice: Subject to any disclaimer, the term of this patent is extended or adjusted under 35 U.S.C. 154(b) by 0 days.

(21) Appl. No.: 11/582,658

(22) Filed: Oct. 17, 2006

(65) Prior Publication Data

US 2007/0037455 A1 Feb. 15, 2007

Related U.S. Application Data

(63) Continuation of application No. 11/100,365, filed on Apr. 5, 2005, now Pat. No. 7,144,280, which is a continuation of application No. 09/971,103, filed on Oct. 3, 2001, now Pat. No. 6,905,372.

(51) Int. Cl.
*H01R 9/22* (2006.01)
(52) U.S. Cl. .................................. 439/709; 439/716
(58) Field of Classification Search ................ 439/716, 439/709, 721
See application file for complete search history.

(56) References Cited

U.S. PATENT DOCUMENTS

| | | |
|---|---|---|
| 4,295,697 A | 10/1981 | Grime |
| 4,358,815 A | 11/1982 | Koslosky et al. |
| 4,867,696 A | 9/1989 | Demler, Jr. et al. |
| 4,869,673 A | 9/1989 | Kreinberg et al. |
| 5,533,905 A | 7/1996 | Hio et al. |
| 5,875,101 A | 2/1999 | Asselta et al. |
| 5,989,073 A | 11/1999 | Kahoun |
| 5,994,989 A | 11/1999 | Rowe et al. |
| 6,012,937 A | 1/2000 | Campbell et al. |
| 6,111,745 A | 8/2000 | Wilkie et al. |

(Continued)

FOREIGN PATENT DOCUMENTS

EP 0 311 706 A1 4/1989

OTHER PUBLICATIONS

"PowerWorx™ Traditional GMT Series Power Distribution Panel User Manual", *ADC Telecommunications, Inc.*, ADCP-80-520, Issue 1, pp. 1-33 (Dec. 1999).

(Continued)

*Primary Examiner*—Briggitte R Hammond
(74) *Attorney, Agent, or Firm*—Merchant & Gould P.C.

(57) ABSTRACT

The present invention relates to a power distribution unit with output power terminals and electrical leads with mating portions connected to extensions of the terminals, with adjacent mating portions and connected extensions offset from one another. Alternatively, an electrical power unit may have one or more power output terminals connected to a corresponding number of power distribution circuits by leads, each lead having a portion parallel to and offset from other adjacent leads in a first direction and another portion parallel to and offset from each adjacent lead in a second direction. The present invention further relates to an output power assembly with inner and outer faces, a first set of terminals on the outer face which are electrically connected to a common conductor along the inner face and a second set of terminals each having individual connectors along the inner face, the individual connectors being offset from each adjacent connector.

15 Claims, 35 Drawing Sheets

U.S. PATENT DOCUMENTS

| | | |
|---|---|---|
| 6,302,709 B1 | 10/2001 | Ross |
| 6,315,580 B1 | 11/2001 | Hurtubise et al. |
| 6,359,770 B1 | 3/2002 | Kolody et al. |
| 6,381,122 B2 | 4/2002 | Wagener |
| 6,905,372 B2 | 6/2005 | Cabrera et al. |

OTHER PUBLICATIONS

"PowerWorx™ Power Distribution Products", *ADC Telecommunications, Inc.*, 6 pages (Aug. 2000).

"PowerWorx® Select Series™ Fuse Platform", *ADC Telecommunications, Inc.*, 8 pages (Aug. 2000).

"Telpower® DC Power Protection Systems. Telpower® Compact Fused Disconnect Switch TPC & TPCDS", *Cooper Bussmann*, Form No. TPCDS, 2 pages (Sep. 24, 2000).

"PowerWorx® SuperPower™ GMT Serie", *ADC Telecommunications, Inc.*, 8 pages (Jan. 2001).

"PowerWorx® Traditional GMT Series", *ADC Telecommunications, Inc.*, 8 pages (Jan. 2001).

"PowerWorx® Uninterrupted Power GMT Series", *ADC Telecommunications, Inc.*, 8 pages (Jan. 2001).

Exhibit A, Telect, Inc., High Current Power Distribution Alarm Panel Users Manual, Issue A, Rev 1, 46 pages (© 1999).

Exhibit B, Telect, Inc., power distribution panel, 17 photographs.

INTERNAL POWER BUS AND POWER OUTPUT ASSEMBLY

CROSS-REFERENCE TO RELATED APPLICATIONS

This application is a continuation of application Ser. No. 11/100,365, filed Apr. 5, 2005, now U.S. Pat. No. 7,144,280 which is a continuation of application Ser. No. 09/971,103, filed Oct. 3, 2001, now U.S. Pat. No. 6,905,372, which applications are incorporated herein by reference.

FIELD OF THE INVENTION

The present invention generally relates internal power buses and power output assemblies for power distribution panels.

BACKGROUND OF THE INVENTION

Power distribution panels are generally mounted in an electronic equipment rack with other devices requiring a source of electric power. The basic function of such a distribution panel is to receive electric power, typically DC power, from an external power source and distribute this power through a bus bar to a series of individual circuits for delivery to the equipment mounted in the rack or in nearby equipment racks. Typically, these individual circuits are protected by fuses or circuit breakers. Common voltages for these panels are 24 and 48 Volts DC. The bus bars commonly handle up to 300 amps or more and the individual circuits are protected by circuit breakers capable of handling of up to 100 amps or more or by fuses capable of handling up to 125 amps or more. In addition, a power distribution panel may have two separate bus bars, meaning the total current being supplied to a panel could be up to 600 Amps.

The amount of electrical current being supplied to a power distribution panel is sufficient to cause injury to persons working around these panels or to adjacent devices. Protective devices or shields are desirable to guard against accidental contact with the exposed power and return current feeds linking the external power sources to the bus bars within the distribution panels. However, depending on the environment where a particular rack might be installed, these external power feeds may come from above, below or the side of the distribution panel. A distribution panel having a power input structure capable of being easily adapted for receiving and protecting power feeds from multiple directions is desirable.

SUMMARY OF THE INVENTION

One aspect of the present invention relates to an internal power bus with electrical leads connected to output power terminals with adjacent leads offset from one another. Another aspect of the present invention relates to an electrical power unit with one or more power output terminals connected to a corresponding number of power distribution circuits by leads, each lead having a portion parallel to and offset from other adjacent leads in a first direction and another portion parallel to and offset from each adjacent lead in a second direction. A further aspect of the present invention relates to an output power assembly with inner and outer faces, having a first set of terminals on the outer face which are electrically connected to a common conductor along the inner face and a second set of terminals each having individual connectors along the inner face, the individual connectors being offset from each adjacent connector.

A variety of advantages of the invention will be set forth in part in the description that follows, and in part will be apparent from the description, or may be learned by practicing the invention. It is to be understood that both the foregoing general description and the following detailed description are exemplary and explanatory only and are not restrictive of the invention as claimed.

BRIEF DESCRIPTION OF THE DRAWINGS

The accompanying drawings, which are incorporated in and constitute a part of the description, illustrate several aspects of the invention and together with the description, serve to explain the principles of the invention. A brief description of the drawings is as follows.

DETAILED DESCRIPTION

Figure 1:
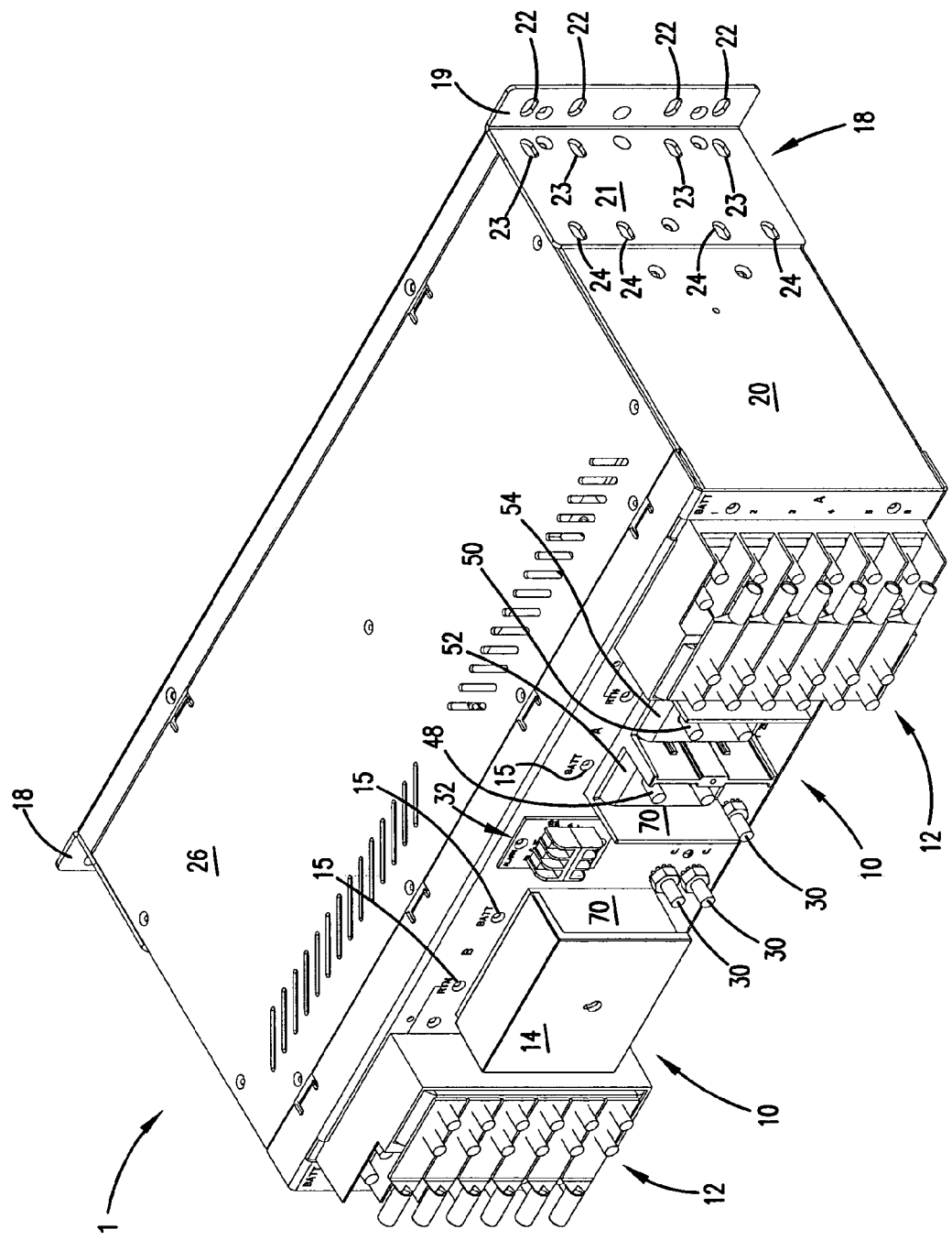
FIG. 1 is a rear perspective view of an embodiment of a power distribution panel in accordance with the present invention.

Reference will now be made in detail to exemplary aspects of the present invention which are illustrated in the accompanying drawings. Wherever possible, the same reference numbers will be used throughout the drawings to refer to the same or like parts.

To prevent accidental contact with the power and return power leads supplying electrical power to a power distribution panel 1, a power input assembly 10 is provided about each power input location. Assembly 10 is designed to provide separation and isolation of the power or battery and return leads from each other and prevent people and/or other devices from contacting the leads and receiving an electrical shock, causing harm to personnel or property.

Internally, due to the amount of current in the power distribution buses 60 and 160, some shielding of the individual power leads 166 prevents unwanted arcing or current induction between adjacent leads. This shielding can be accomplished by coating the leads with an electrically insulative material or by providing sufficient separation of the leads. Providing separation of leads 166 also provides improved access to components within panel 1 for users.

Referring now to FIGS. 1 through 4, a power distribution panel 1 with two power busses and two power input assemblies 10 installed is shown. A first power input assembly 10 is shown with cover 14 in place and a second assembly 10 is shown with cover 14 removed. Panel 1 includes a housing with a rear face 28, a front face 34, a top 26, a bottom 44 and two opposing sides 20. Mounted to each side 20 proximate front face 34 are mounting flanges 18 for mounting panel 1 to a telecommunications equipment rack. Because telecommunications equipment racks vary in width, flanges 18 include several columns of mounting holes and may be mounted in different orientations. Flange 18 includes long side 21 and short side 19. Long side 21 includes two columns of mounting holes 23 and 24. Short side 19 includes a single column of mounting holes 22. Panel 1 can be mounted to a variety of different width mounting racks by altering the orientation of flanges 18 mounted on either side 20 of panel 1. For example, mounting flanges 18 with short flange 19 adjacent both sides 20 would allow panel 1 to mounted to a relatively wider rack, while mounting flanges 18 with long side 21 adjacent sides 20 would permit panel 1 to be mounted to a relatively narrower rack. Additional sizes and configurations of flanges 18 are anticipated which would permit panel 1 to be mounted to telecommunications racks of different widths.

Figure 2:
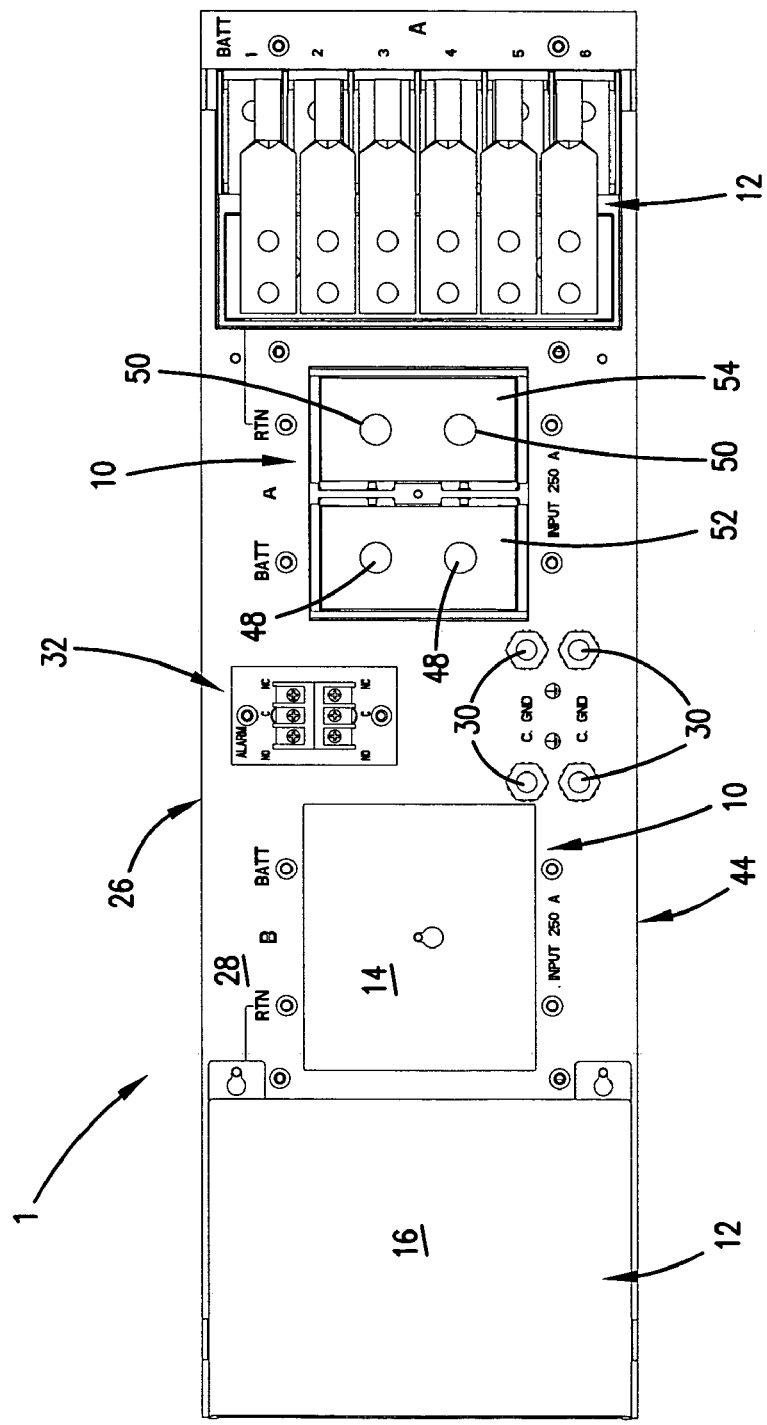
FIG. 2 is a rear view of the power distribution of FIG. 1, with the mounting flanges removed.
Figure 3:
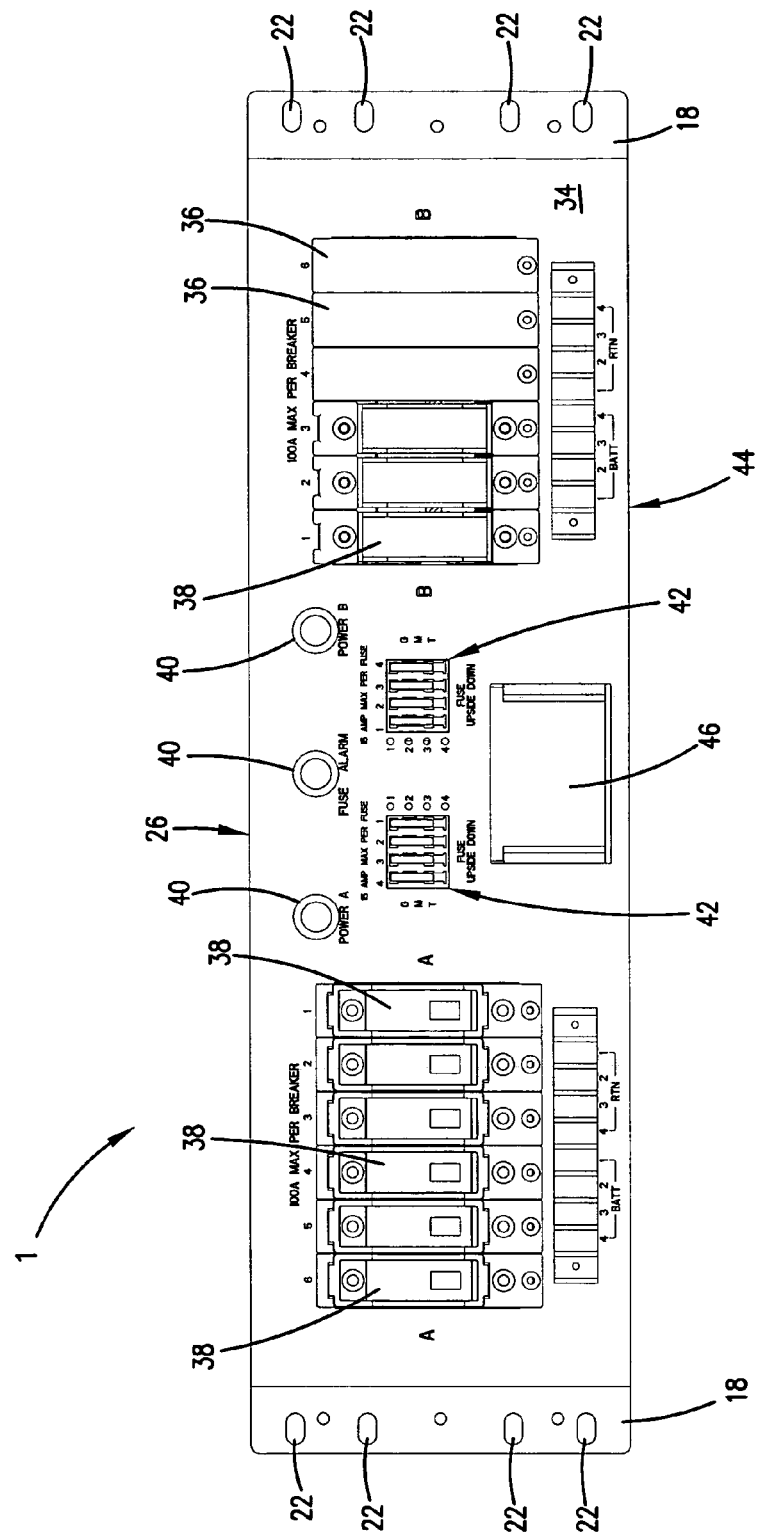
FIG. 3 is a front view of the power distribution panel of FIG. 1.
Figure 4:
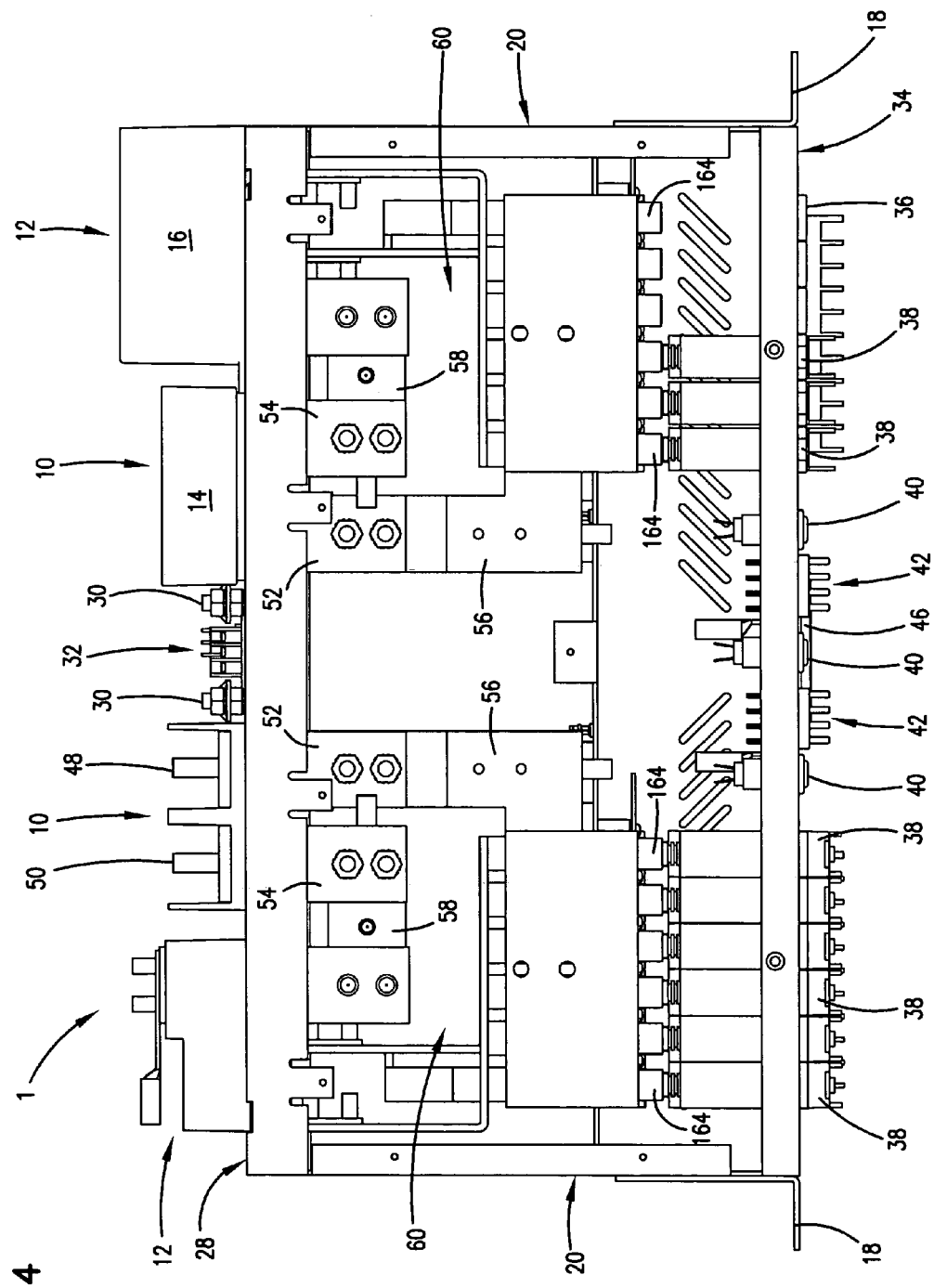
FIG. 4 is a top view of the power distribution panel of FIG. 1 with the top cover removed.

Mounted to rear face 28 are two sets of power output terminals 12. Output terminals 12 are then connected to the power input terminals of telecommunications devices to supply power to those devices. In FIGS. 2 and 4, one of the sets of output terminals 12 is covered by a protective housing 16 to prevent accidental contact with the terminals. Chassis grounds 30 are provided on rear face 28 and allow panel 1 to be electrically connected to a ground. Panel 1 includes an internal circuitry which senses interruptions or other problems with the power flowing through the panel. This circuitry is tied to an alarm which can provide a visible, audible or electronic signal when a power flow problem is detected. The electronic alarm signals allow the alarm status of a power panel to be remotely or centrally monitored. Power alarm connector 32 is provided on rear face 28 for the transmission of the electronic signals for remote or central monitoring.

On the front face of panel 1 are circuit breakers 38 and fuses 42 to provide protection for the equipment to which panel 1 is supplying power. Additional breaker locations 36 are available to allow more breakers to be mounted to panel 1. Circuit breakers 38 could alternatively replaced by fuses. Signal lamps 40 are connected with the alarm in panel 1 to provide the visible signal if a power flow problem is detected. Holder 46 is provided on front face 34 to maintain indicia regarding the devices which are being supplied power by panel 1.

Power input assembly 10 includes a power conductor 52 with posts 48 and a return conductor 54 with posts 50. Conductors 52 and 54 are attached to buses 60 inside panel 1. Posts 48 are connected with the power terminal of the power source supplying panel 1 and posts 50 are connected with the return terminal of the power source supplying the panel. Posts 48 are electrically connected to conductor 52, which are in turn electrically connected with a power bus end 56 of bus 60. Posts 50 are electrically connected to conductor 54, which are in turn electrically connected with a return bus end 58 of bus 60.

Referring now to FIGS. 1 through 10, assembly 10 includes a housing 70 with opposing sidewalls 72, a base 76 extending between the sidewalls and a centerwall 74 parallel to the sidewalls and generally bisecting the base into two halves. In centerwall 74 is an opening 94 for receiving a fastener holding cover 14 in place on housing 70. Between sidewalls 72 on either side of centerwall 74 are defined cavities 71 and 77 for receiving power cables from an external power supply. Each sidewall 72 has a first end 73 and a second end 75. Between first ends 72 is endwall 88 which cooperates with base 76 to form conductor openings 78 proximate first ends 73. Likewise, between second ends 75 is endwall 88 which cooperates with base 76 to form conductor openings 78 proximate second ends 75. Extending from each endwall 88 is mounting tab 80, which include openings 82 to receive fasteners such as screws to mount housing 70 to rear face 28. Along endwalls 88 opposite base 76 are openings 92, which receive fasteners such as screws for holding conductors 52 and 54 to housing 70, as is discussed below. Along the bottom of base 76 and extending between the opposing sidewalls 72 and opposing endwalls 88 are reinforcing ribs 84. Ribs 84 provide added strength and stiffness to housing 70. Likewise, along the bottom of mounting tabs 80 are reinforcing ribs 86, and extending from the top of base 76 along centerwall 74 are reinforcing ribs 96. Proximate the junctions of endwalls 88 and reinforcing rib 84 are opening 90 for receiving fasteners such as screws.

Figure 5:
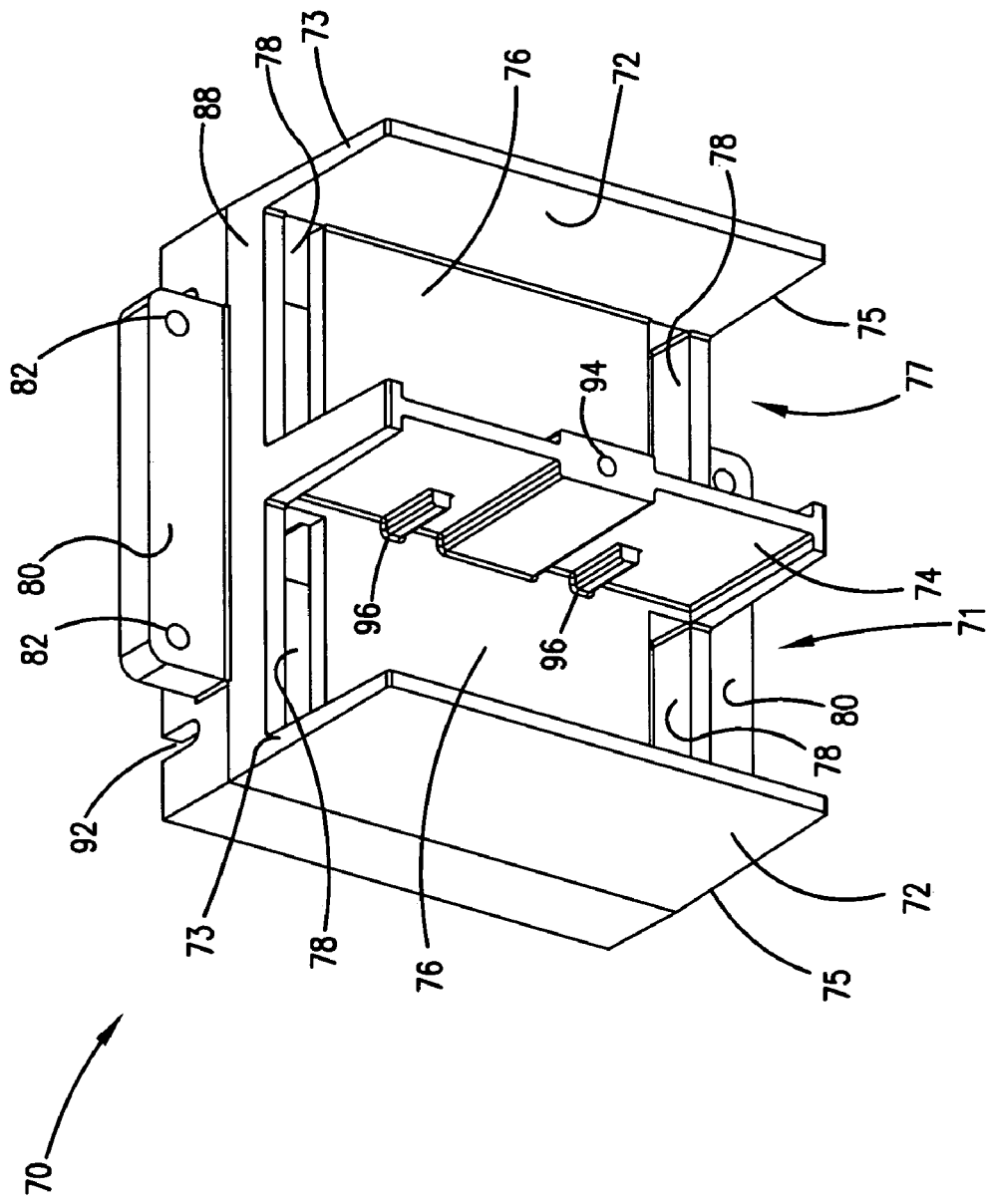
FIG. 5 is a rear perspective view of a power input housing in accordance with the present invention.
Figure 6:
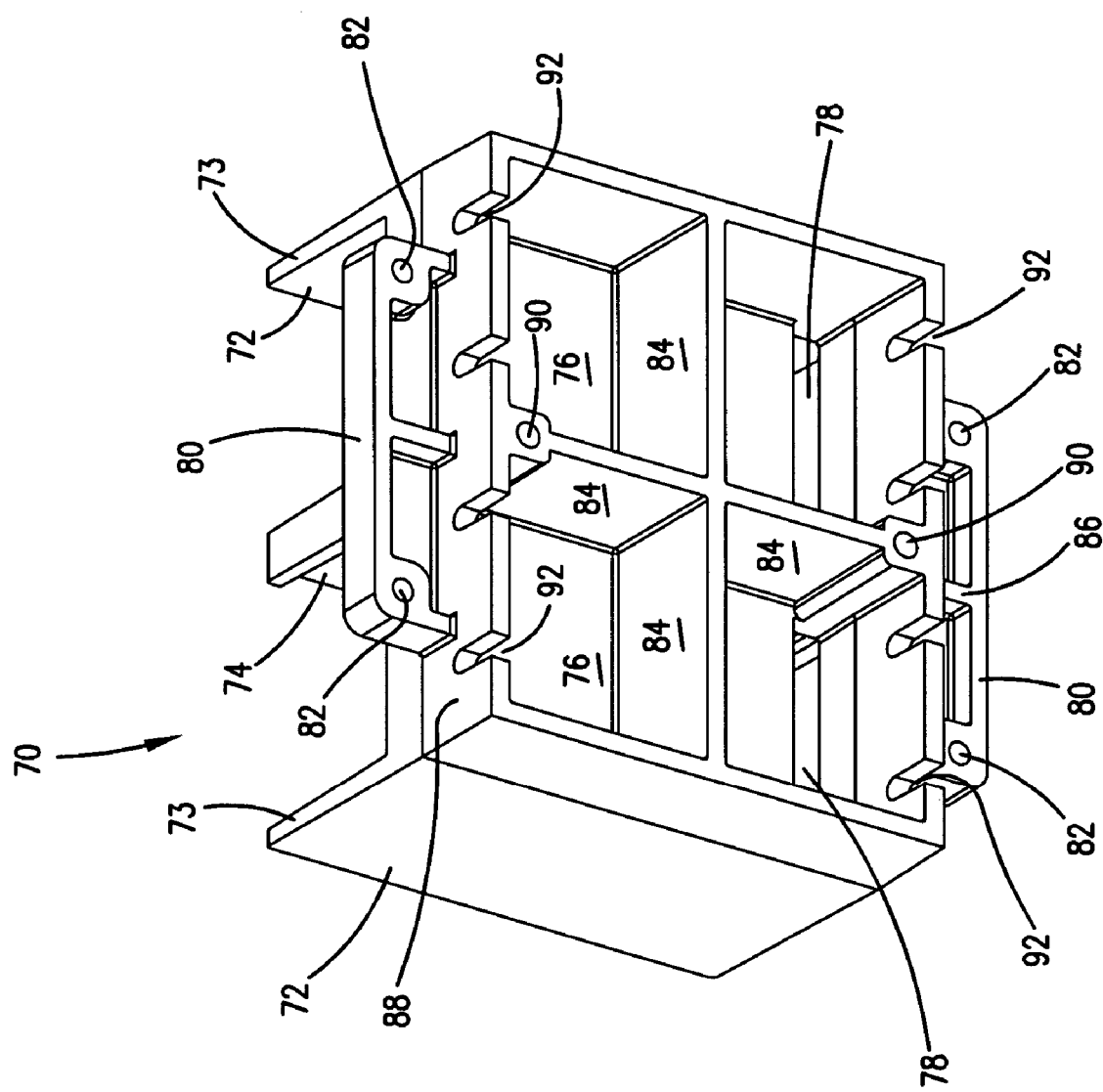
FIG. 6 is a front perspective view of the power input housing of FIG. 5.
Figure 7:
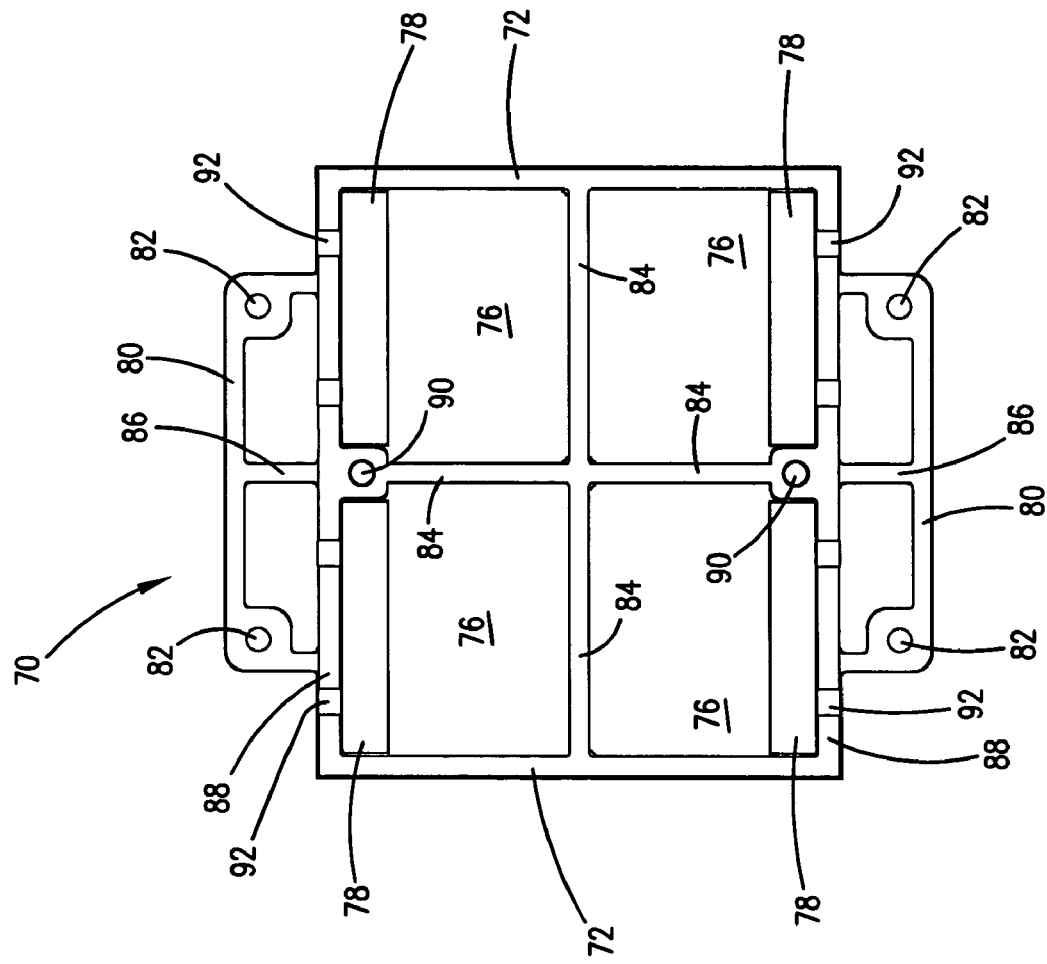
FIG. 7 is a front view of the power input housing of FIG. 5.
Figure 8:
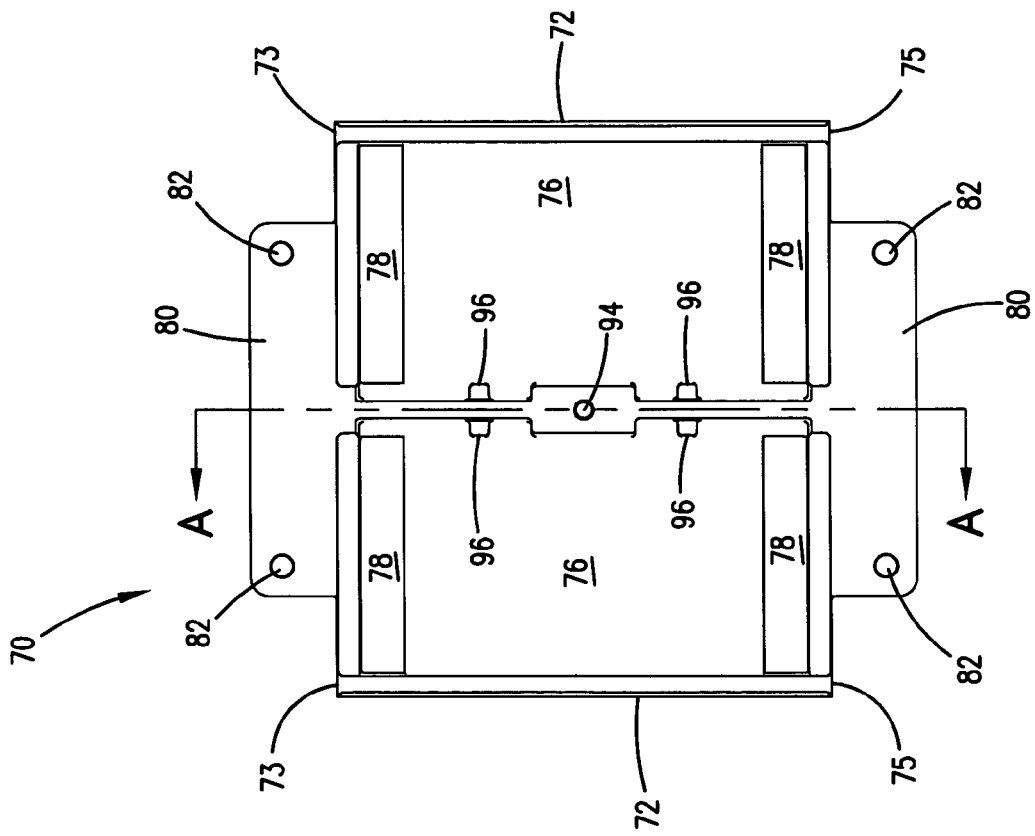
FIG. 8 is a rear view of the power input housing of FIG. 5.
Figure 9:
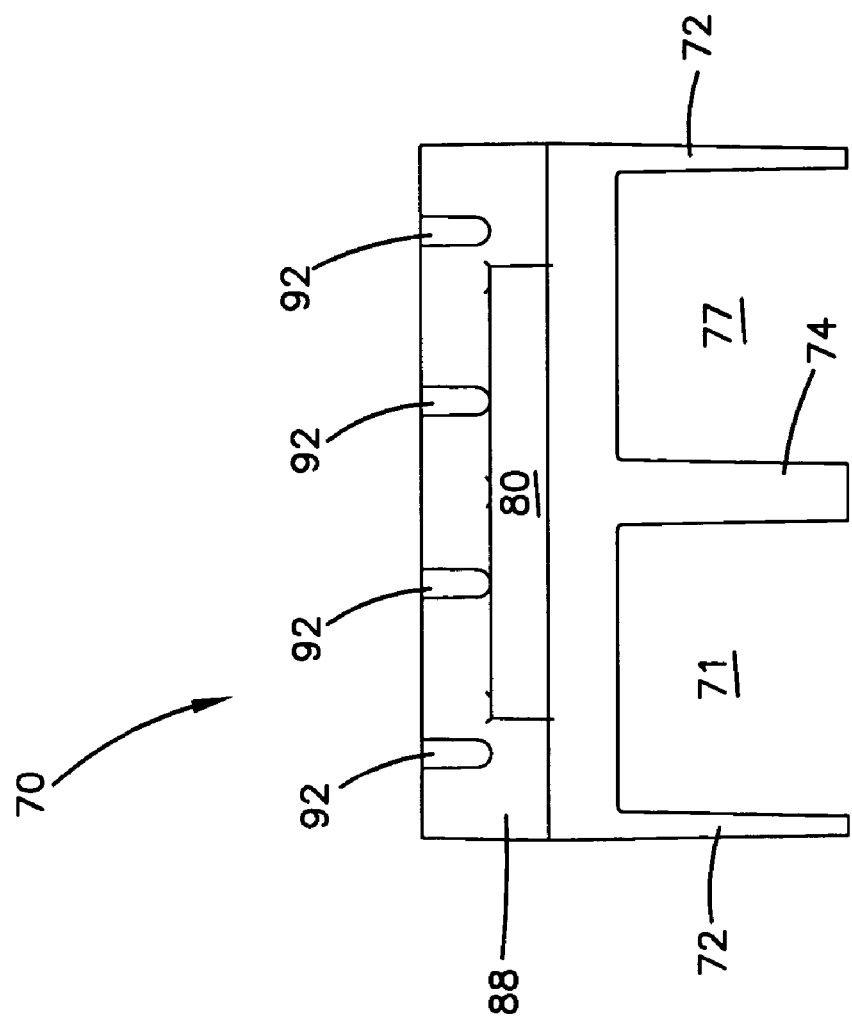
FIG. 9 is a top view of the power input housing of FIG. 5.
Figure 10:
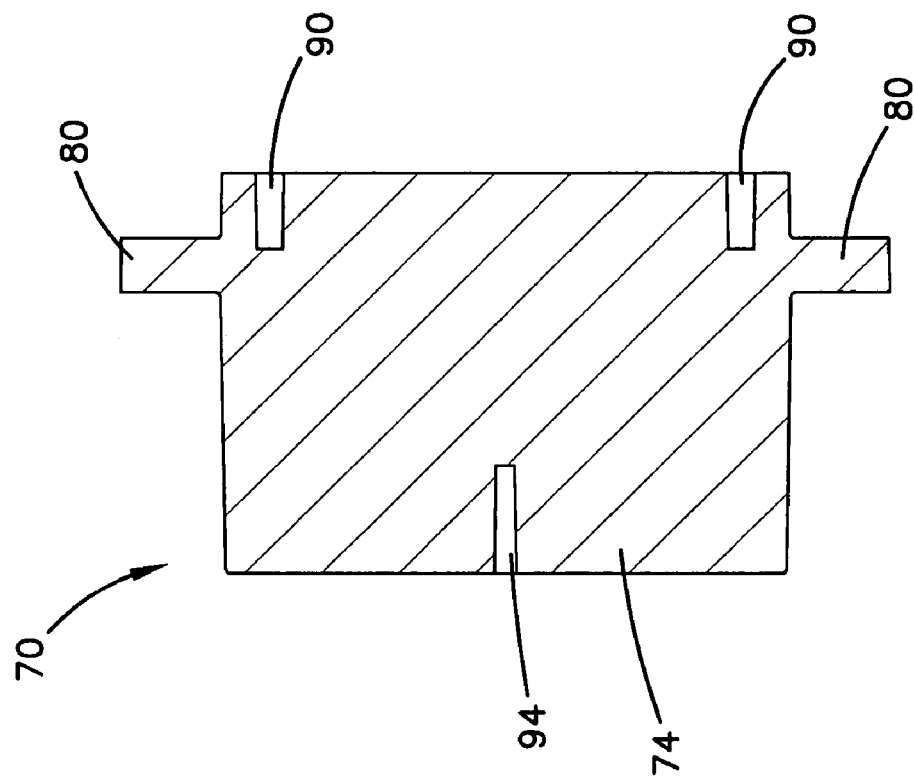
FIG. 10 is a cross-sectional view of the power input housing of FIG. 8 taken along line A-A.
Figure 11:
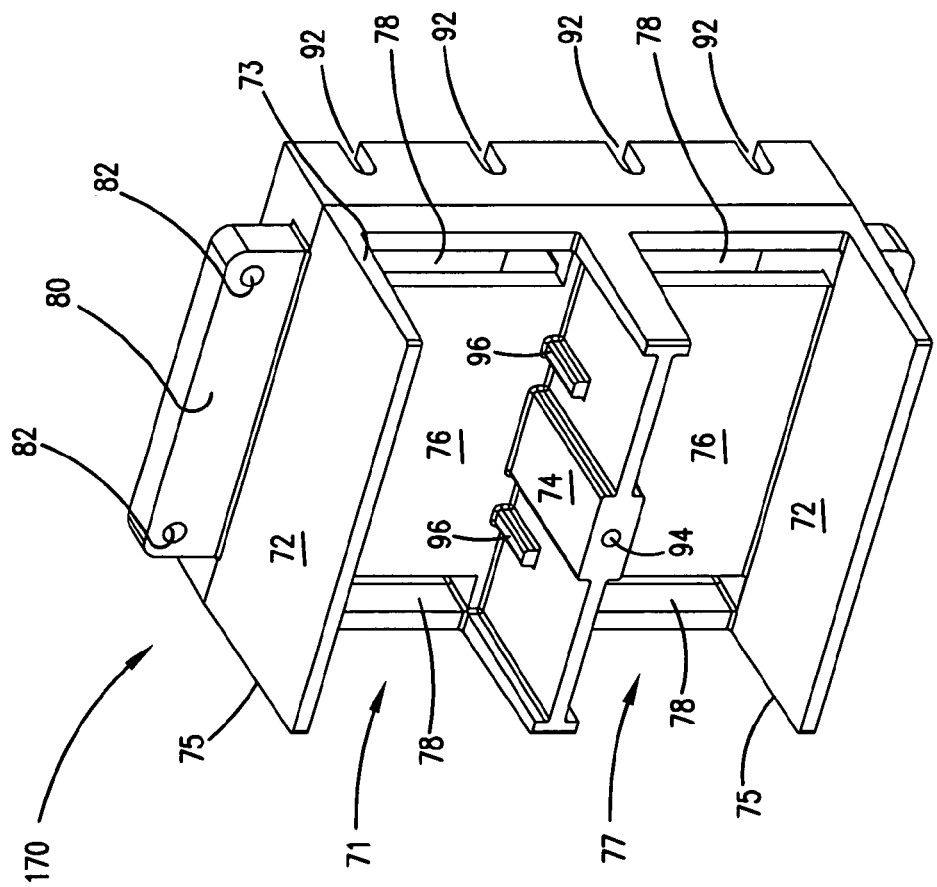
FIG. 11 is a rear perspective view of an alternative power input housing in accordance with the present invention.
Figure 12:
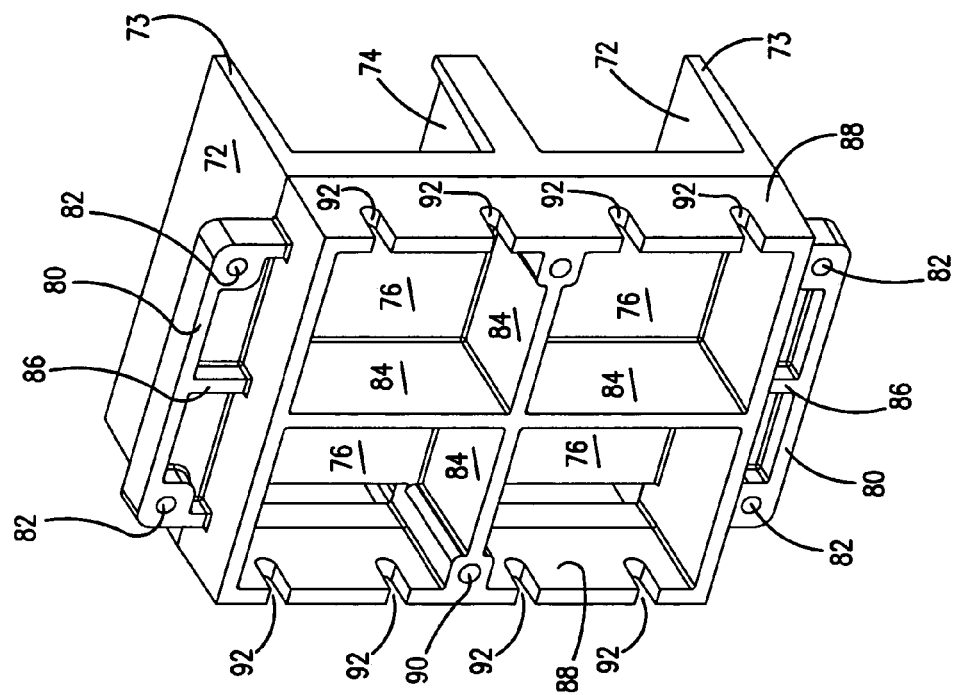
FIG. 12 is a front perspective view of the power input housing of FIG. 11.
Figure 13:
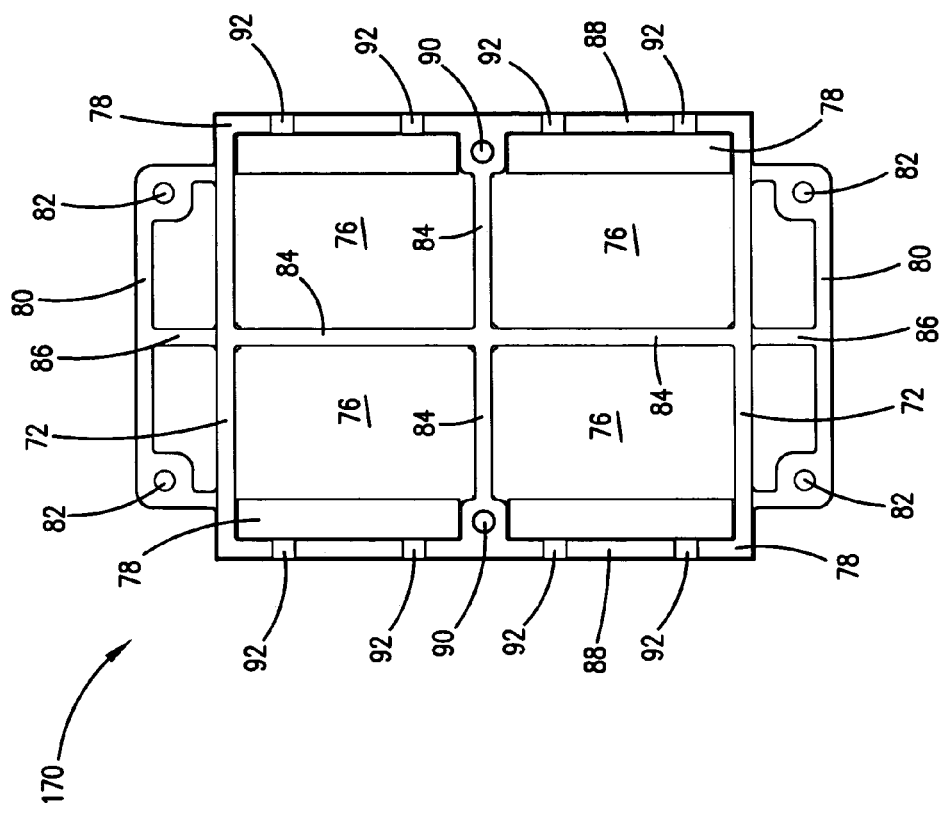
FIG. 13 is a front view of the power input housing of FIG. 11.
Figure 14:
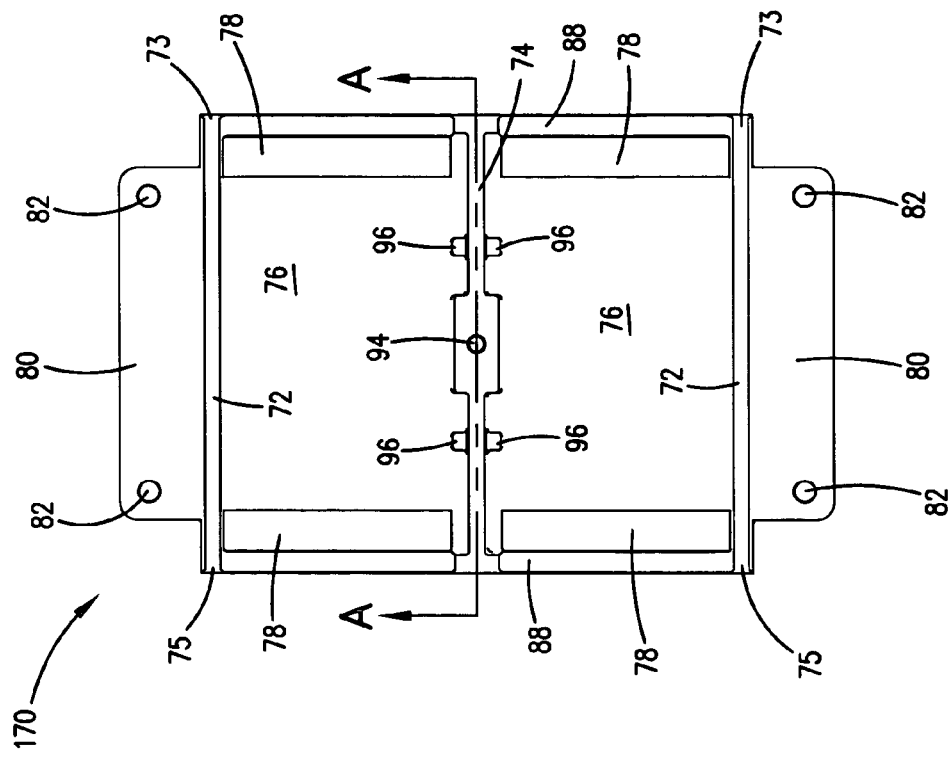
FIG. 14 is a rear view of the power input housing of FIG. 11.
Figure 15:
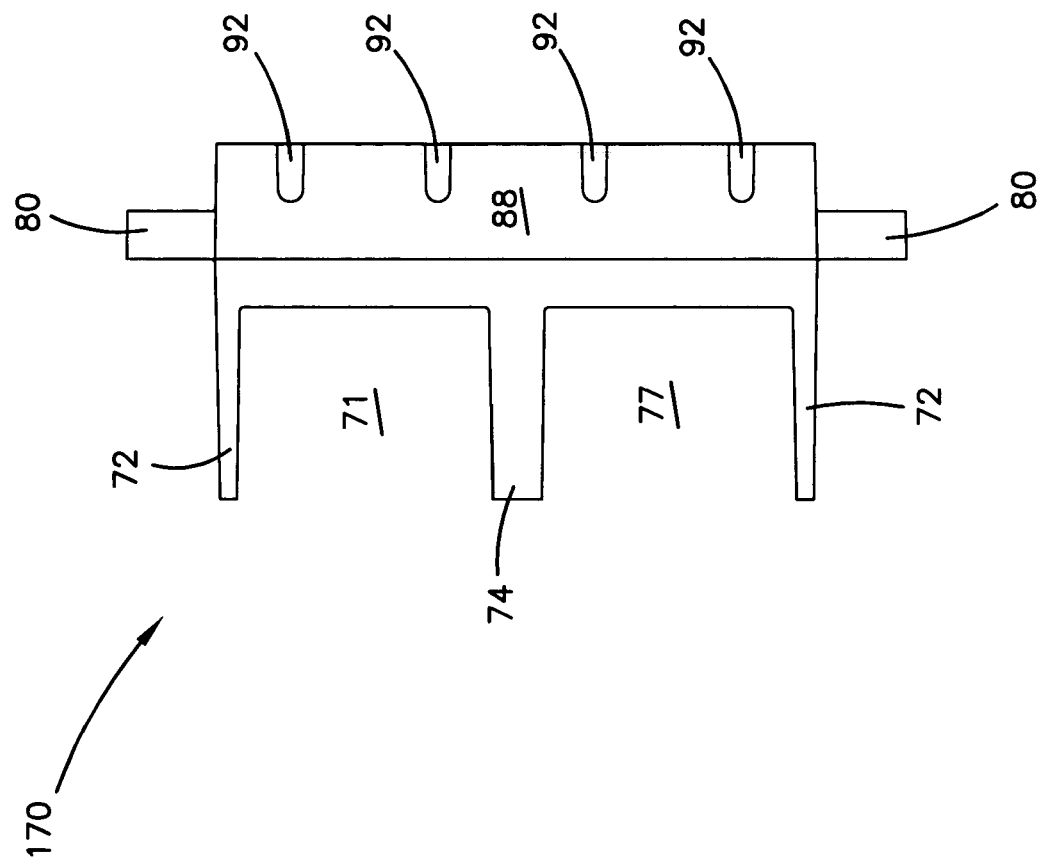
FIG. 15 is a side view of the power input housing of FIG. 11.
Figure 16:
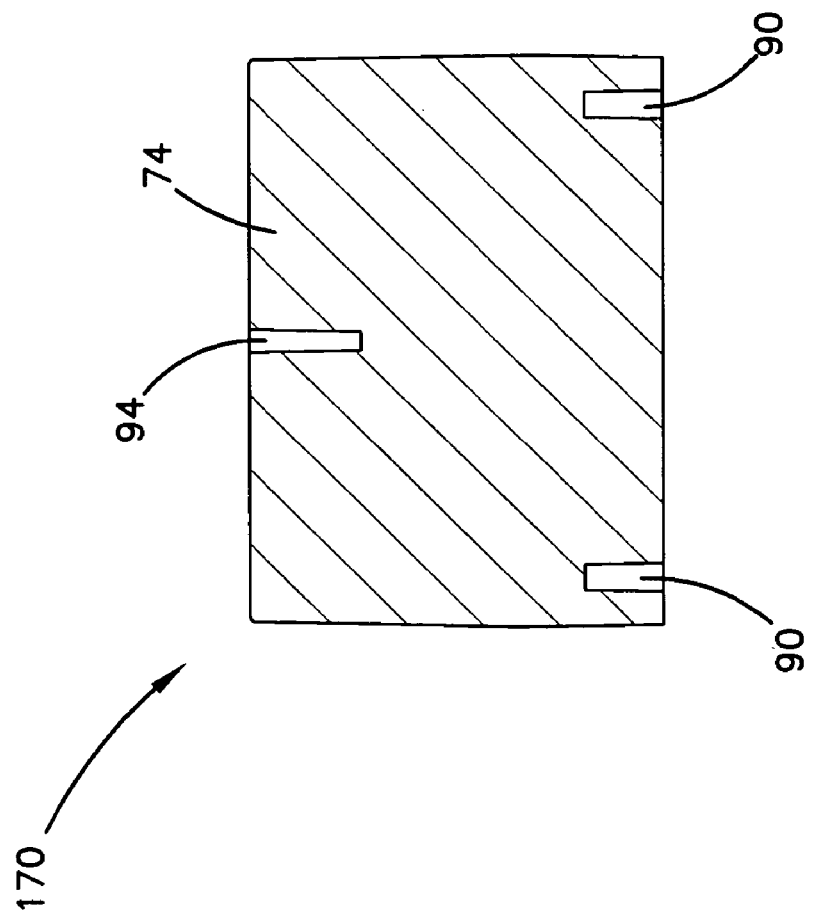
FIG. 16 is a cross-sectional view of the power input housing of FIG. 14 taken along line A-A.

As shown in FIGS. 5 though 10, mounting tabs 80 are located proximate conductor openings 78, and cavities 71 and 77 are oriented to receive power cables from above or below panel 1. As shown in FIG. 1, housing 70 is mounted to rear face 28 so that mounting tabs 80 are on the inside of panel 1 and sidewalls 72 and centerwall 74 extend through rear face 28 outside of panel 1. Mounting openings 15 in rear face 28 are located above and below housing 70 and are located so that a fastener such as a screw can be inserted through an opening 15 and engage opening 82 to hold housing 70 to rear face 28.

Referring now to FIGS. 11 through 16, housing 170 is shown. Housing 170 is similarly constructed to housing 70, with mounting tabs 80 located on different opposing walls. If housing 170 were mounted to rear face 28 of panel 1, cavities 71 and 77 would be oriented to receive power cables from either the left side or right side of panel 1. Both housing 70 and housing 170 are made of electrically insulative material.

Figure 17:
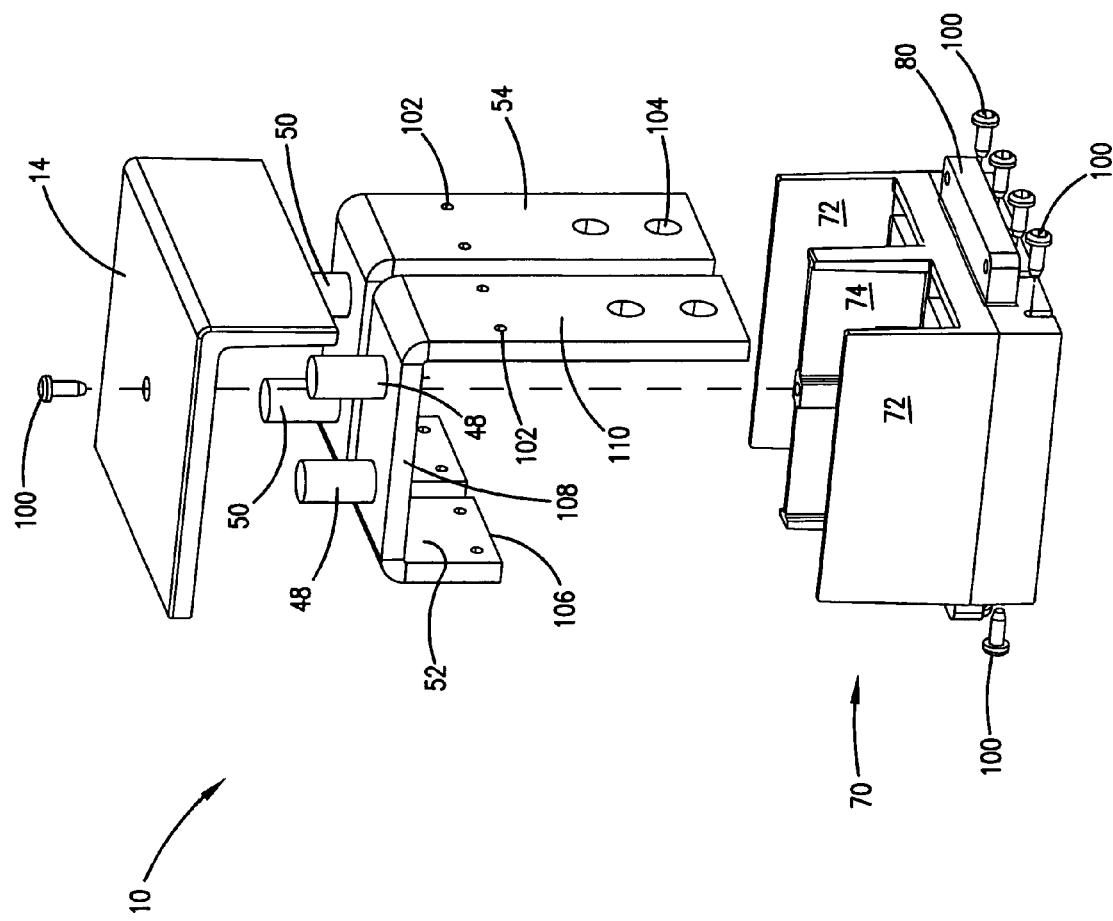
FIG. 17 is an exploded rear view of a power input assembly in accordance with the present invention with the cover positioned for entry of power cables from above the assembly.
Figure 18:
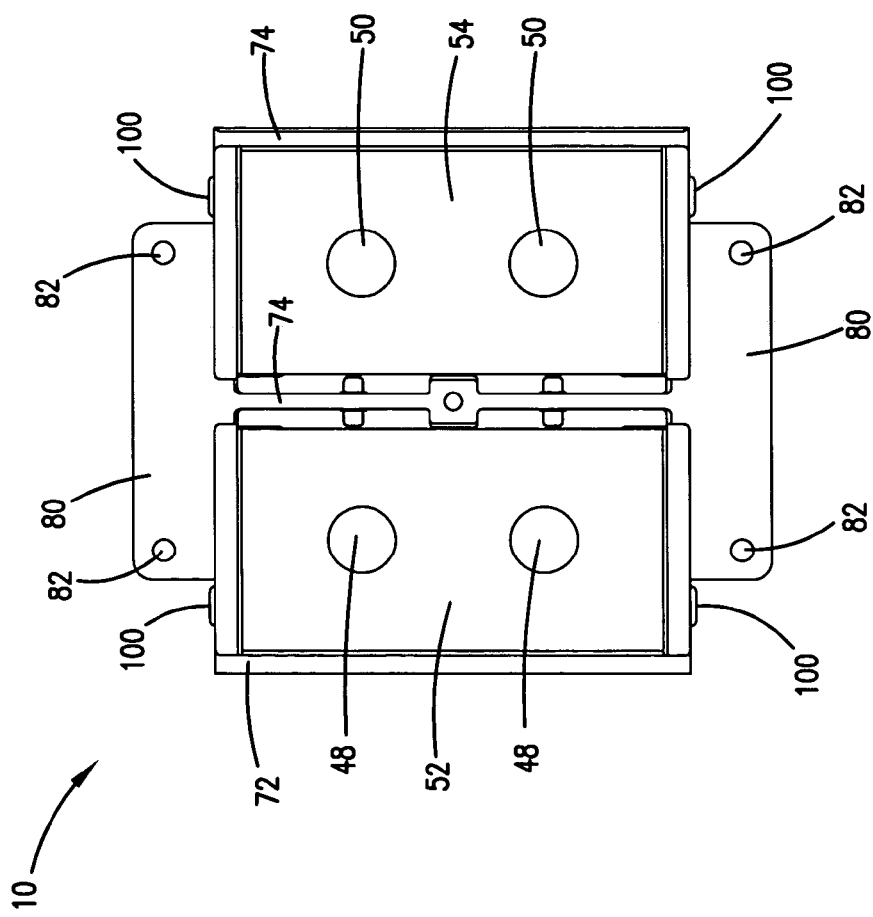
FIG. 18 is a rear view of the power input assembly of FIG. 17 with the cover removed.
Figure 19:
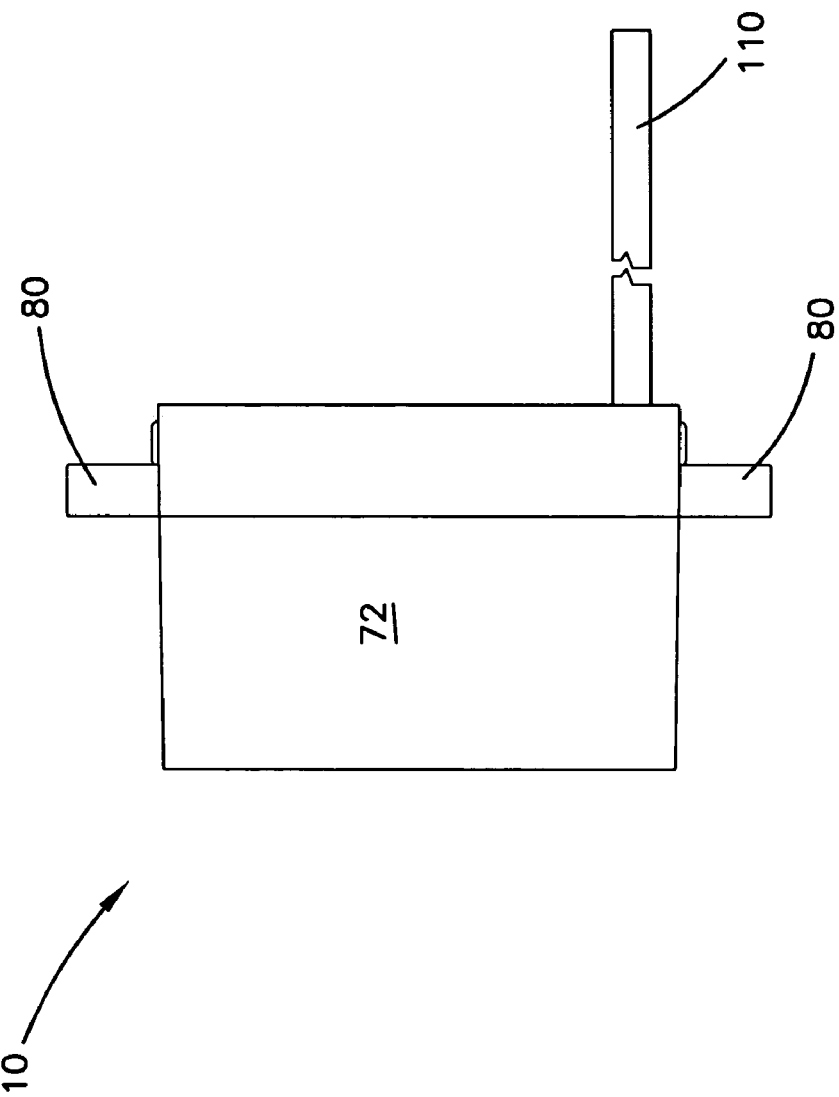
FIG. 19 is a side view of the power input assembly of FIG. 18.
Figure 20:
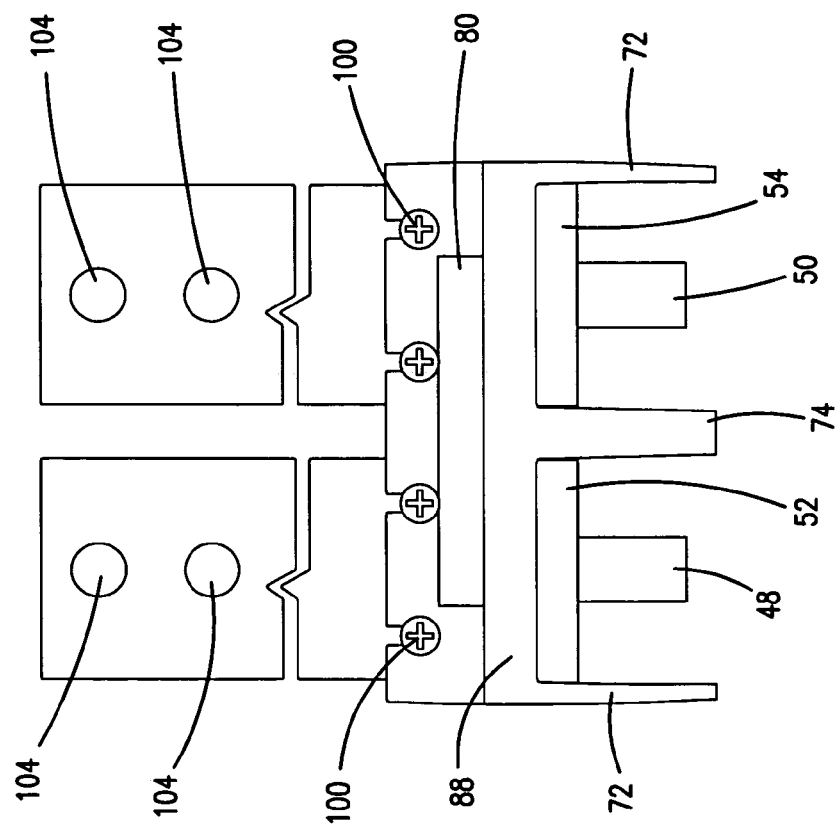
FIG. 20 is a top view of the power input assembly of FIG. 18.

Referring now to FIGS. 17 through 20, a power input assembly is shown. In FIG. 17, conductors 52 and 54 include of a first leg 106, a cross leg 108 and a second leg 110. First and second legs 106 and 110 extend through openings 78 of housing 70 and cross leg 108 lies along the top of base 76. Conductor 52 is placed within cavity 71 and conductor 54 is placed within cavity 77. Posts 48 extend from cross leg 108 of conductor 52 opposite base 76 and posts 50 extend from cross leg 108 of conductor 54 opposite base 76. Second leg 110 and first leg 106 include openings 102. Fasteners such as screws 100 are inserted through openings 92 in endwalls 88 and engage openings 102, holdings the straps to housing 70. Proximate an end of second leg 110 opposite cross leg 108 are openings 104 for attaching and electrically connecting conductor 52 to power bus end 56 of bus 60, and for attaching and electrically connecting conductor 54 to return bus end 58 of bus 60. Conductors 52 and 54 are held by housing 70 and are separated from potential contact by centerwall 74.

Figure 21:
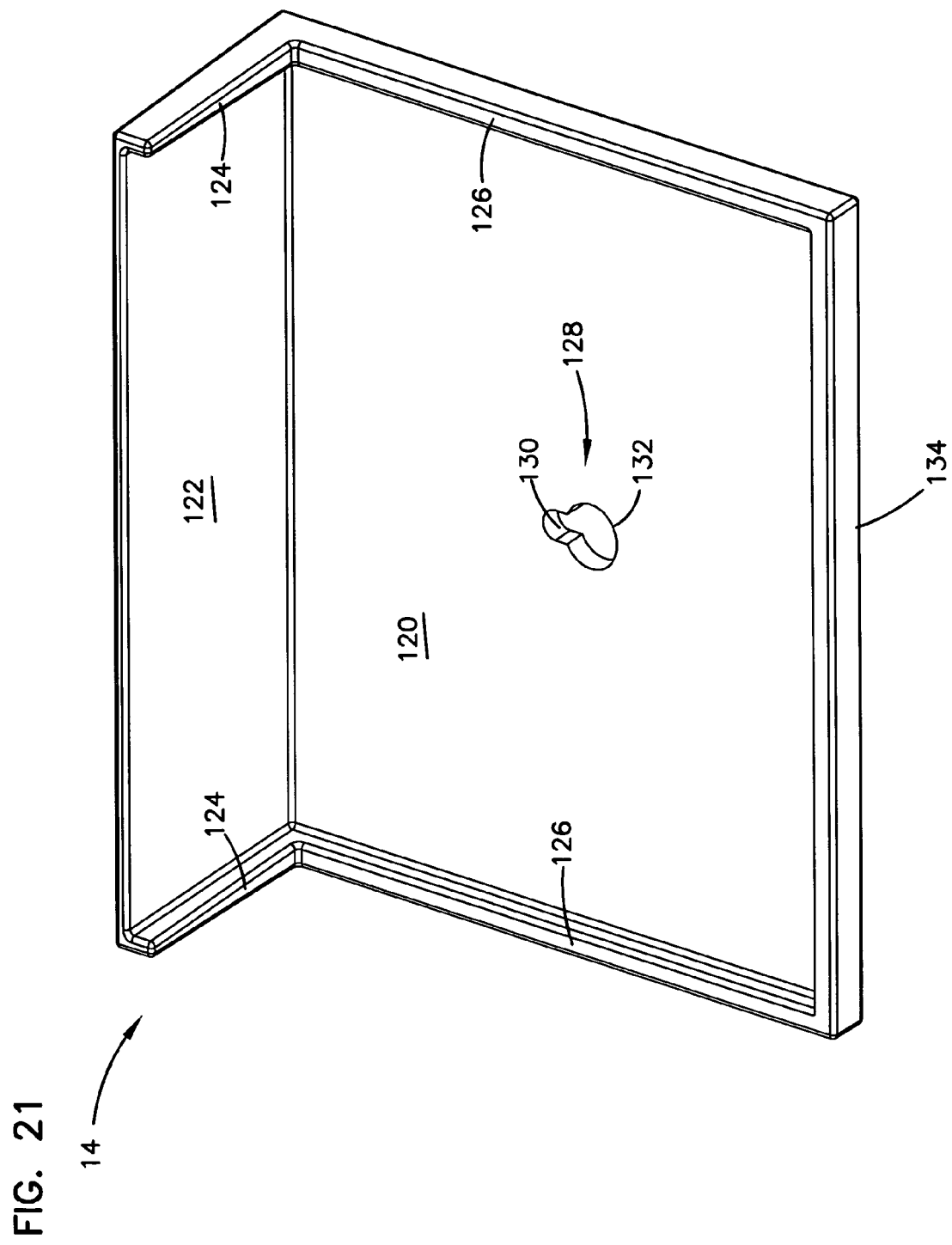
FIG. 21 is a front perspective view of a cover for a power input assembly in accordance with the present invention.
Figure 22:
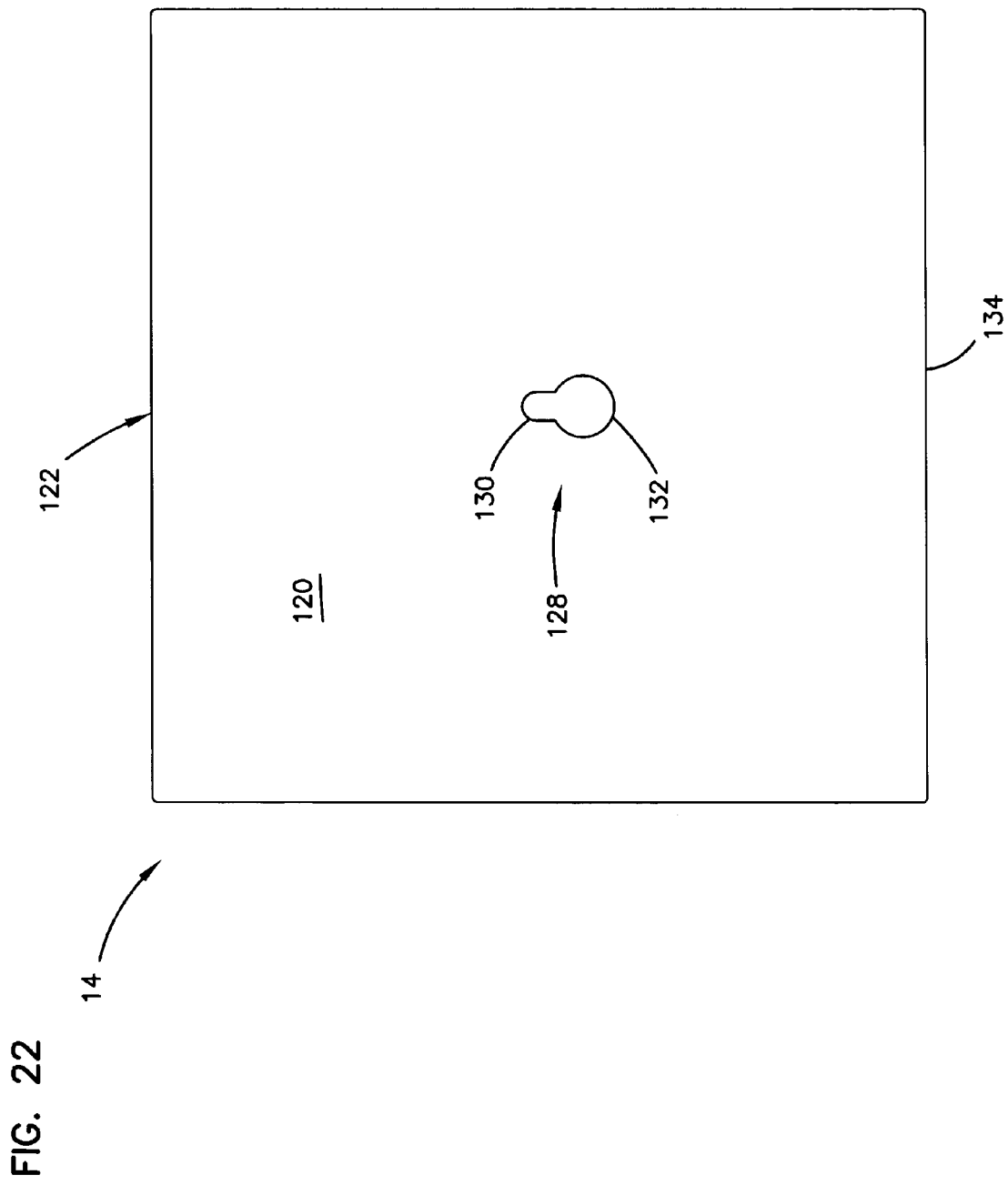
FIG. 22 is a rear view of the cover of FIG. 21.
Figure 23:
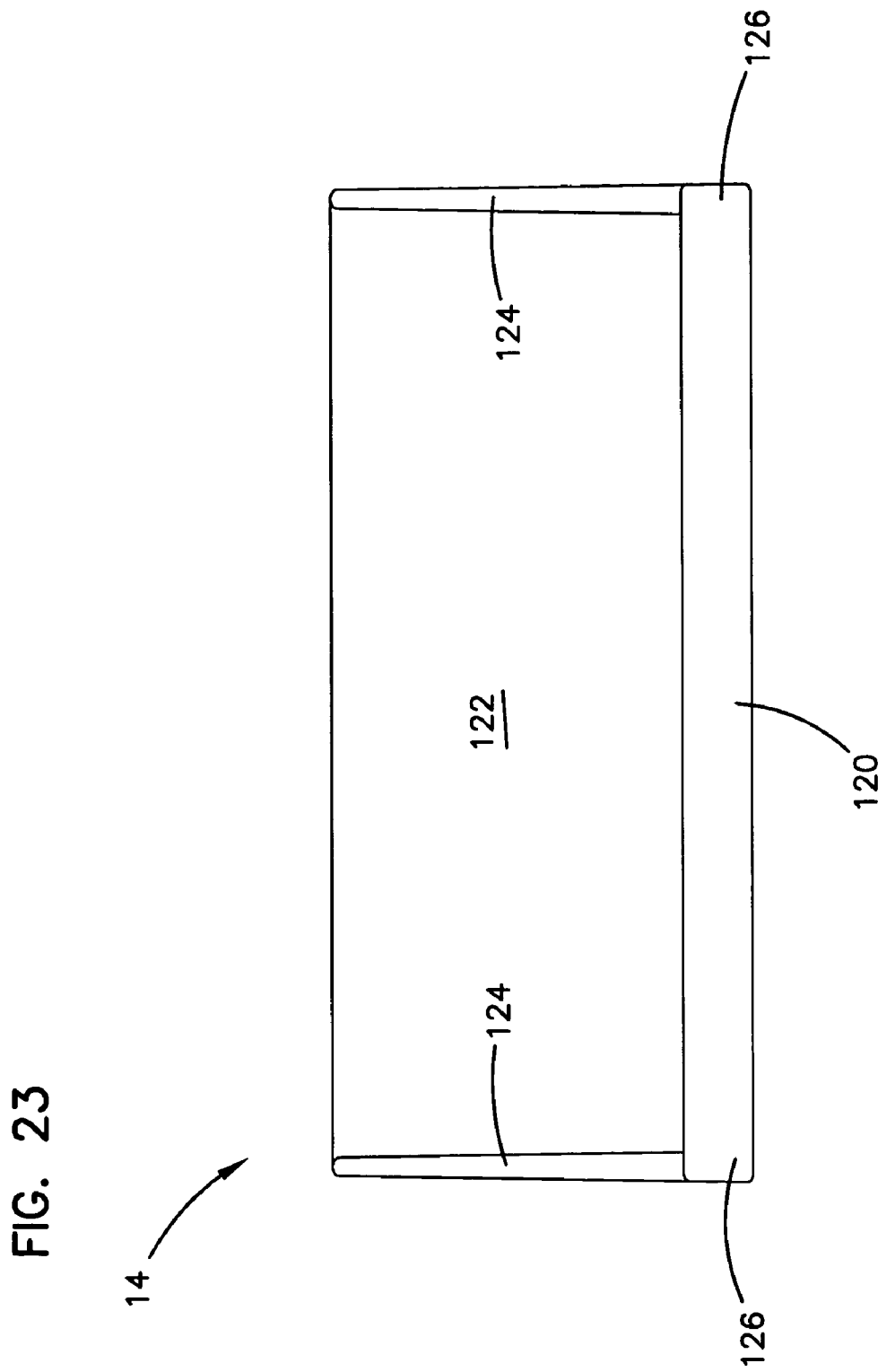
FIG. 23 is a bottom view of the cover of FIG. 21.

FIGS. 21 through 23 show cover 14. References to housing 70 are intended to apply also for housing 170. Cover 14 includes a top 120 and a lower extension 122. Top 120 is sized to fit on housing 70 covering cavities 71 and 77, so that ledges 126 rest just outside of the top of sidewalls 72, extension 122 is proximate one of first end 73 or second end 75 of sidewalls 72 and ledge 134 is at the other of first end 73 or second end 75. When mounted to housing 70, extension 122 extends between sidewalls 72 across both cavities 71 and 77 and between top 120 and endwall 88. Ledges 124 rest just outside of first or second ends 73 or 75 of sidewalls 72 when cover 14 is mounted to housing 70. Ledge 134 extends between parallel to extension 122 on the opposite open end of housing 70 but does not extend far enough to close the open end. In this position, cover 14 closes off access to cavities 71 and 77 from the rear and from one of the two ends. Ledges 126 and 134 are shown as the same size but may be of different sizes. Ledges 126 may extend up to the same extent as extension 122 while ledge 134 may not be made so large as to block the open end opposite extension 122.

Mounting opening 128 in top 120 includes a narrow end 130 and a wide end 132. Opening 128 is sized and located to receive a fastener extending from opening 94 in housing 70 to hold cover 14 to housing 70. The shape of opening 128 is sized to allow cover 14 to be removed from housing 70 without completely removing the screw from opening 94. Narrow end 130 and wide end 132 are oriented to be generally parallel to ledges 126.

Cover 14 and housing 70 are designed so that cover 14 may be mounted to housing 70 with extension 122 at either first end 73 or second end 75 of sidewalls 72. This will permit power supply cables from an external power source to enter from above or below as the installation environment dictates without requiring a different version of cover 14 for each direction of entry. With regard to housing 170, power cables can enter the housing from either end and cover 14 will be installed with extension 122 covering the opposite end. Cover 14 is made of an electrically insulative material.

Figure 24:
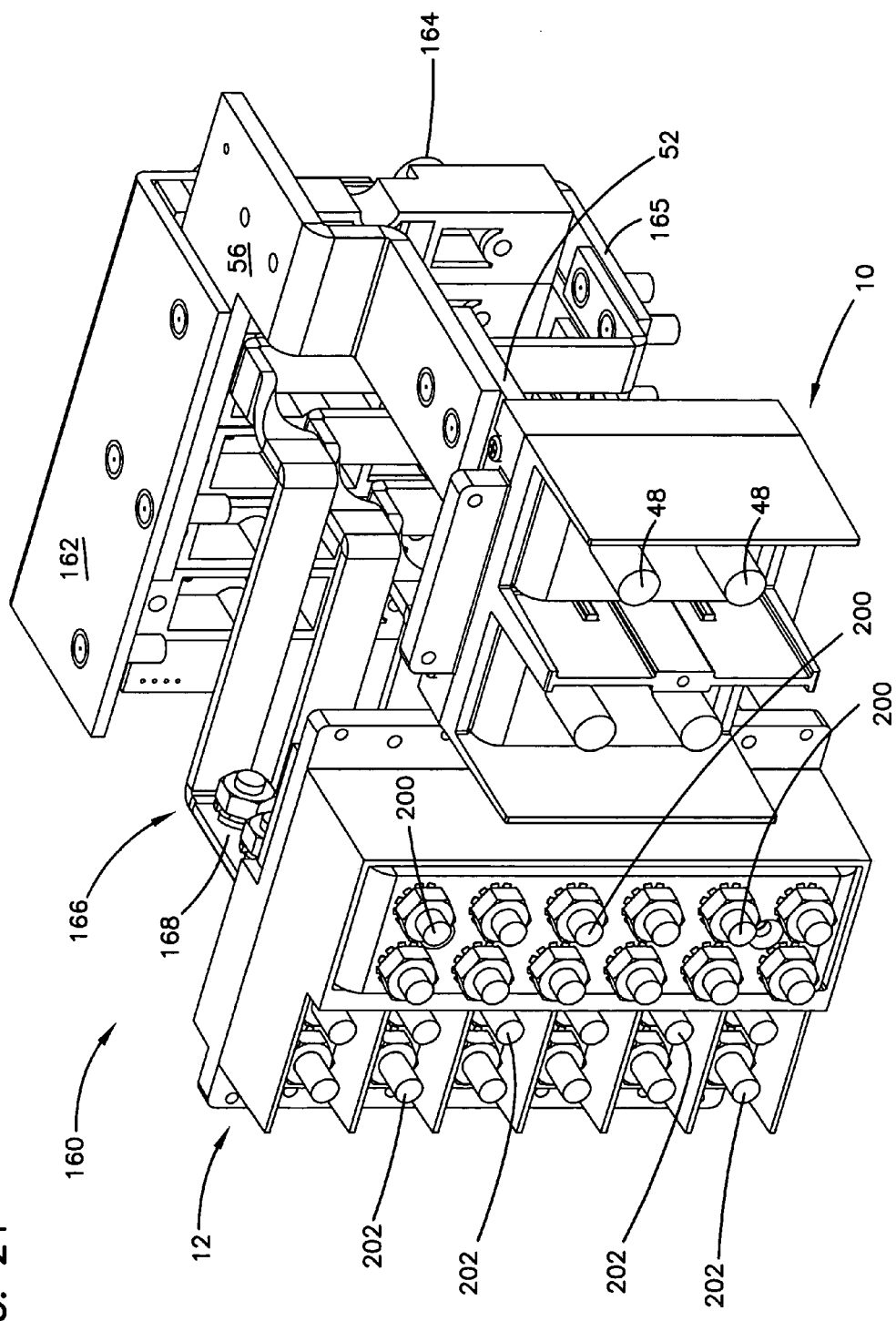
FIG. 24 is a rear perspective view of an alternative power distribution bus in accordance to the present invention for use with the power distribution panel of FIG. 1.
Figure 25:
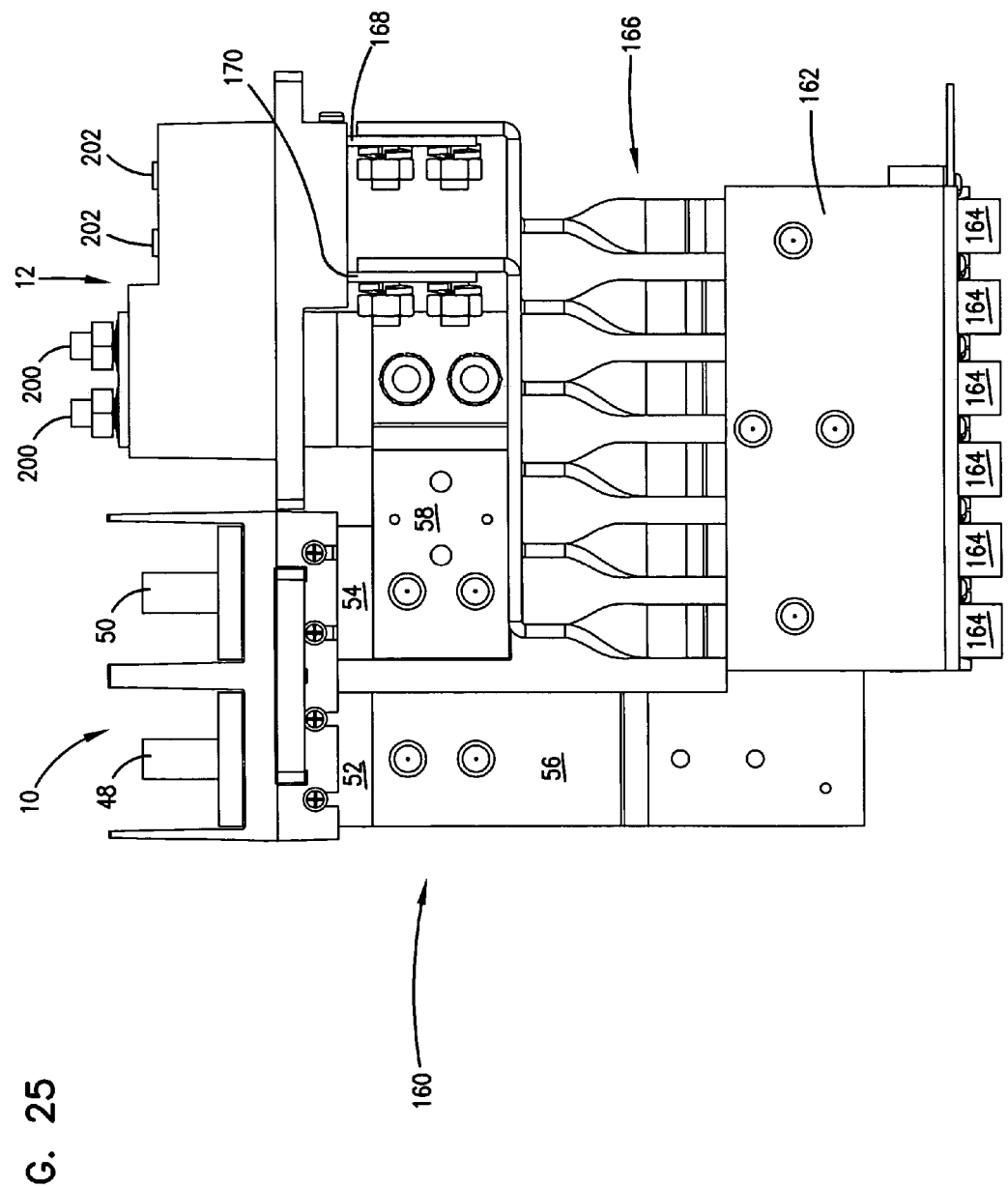
FIG. 25 is a top view of the power distribution bus of FIG. 24.
Figure 26:
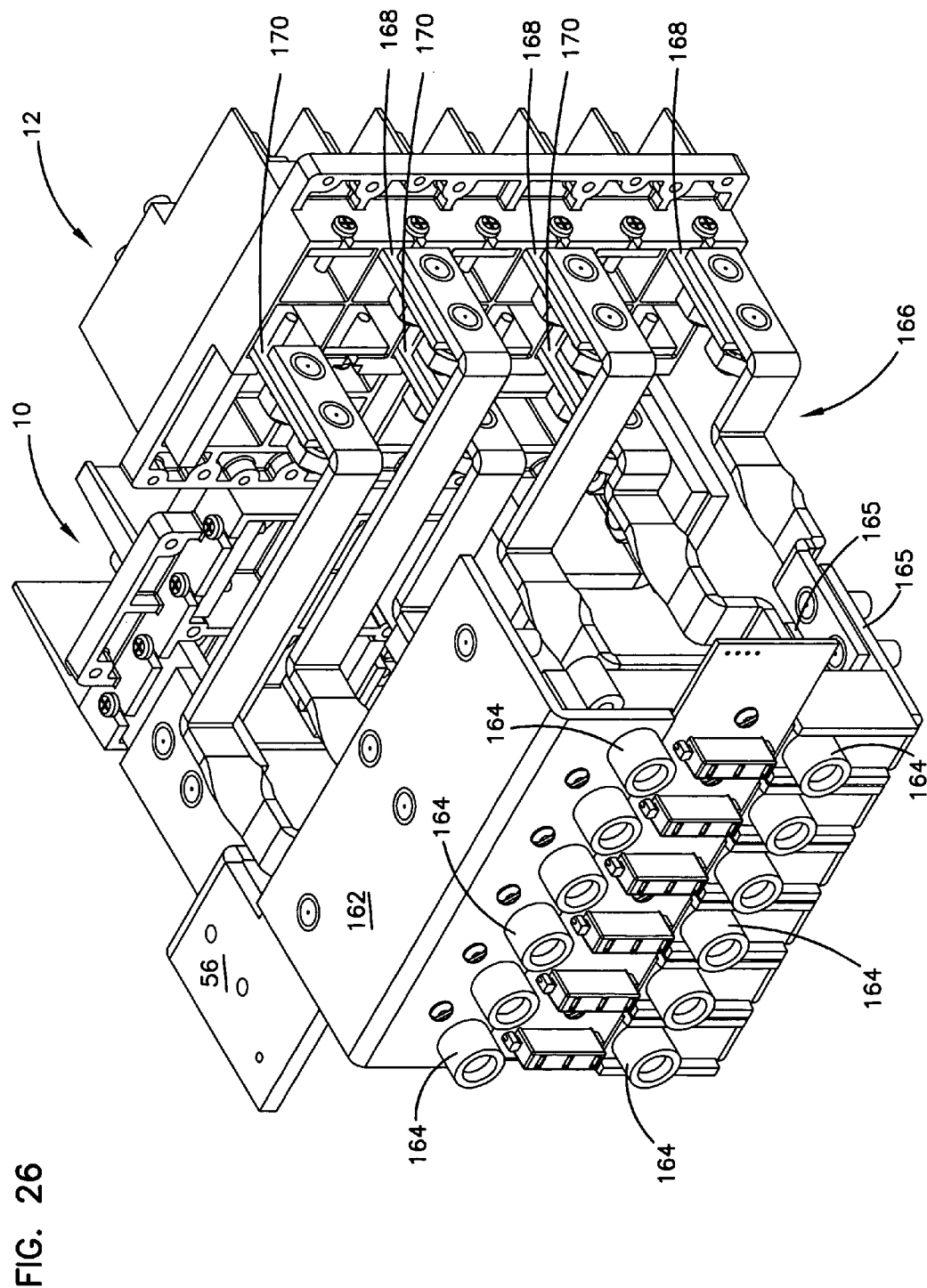
FIG. 26 is a front perspective view of the power distribution bus of FIG. 24.
Figure 27:
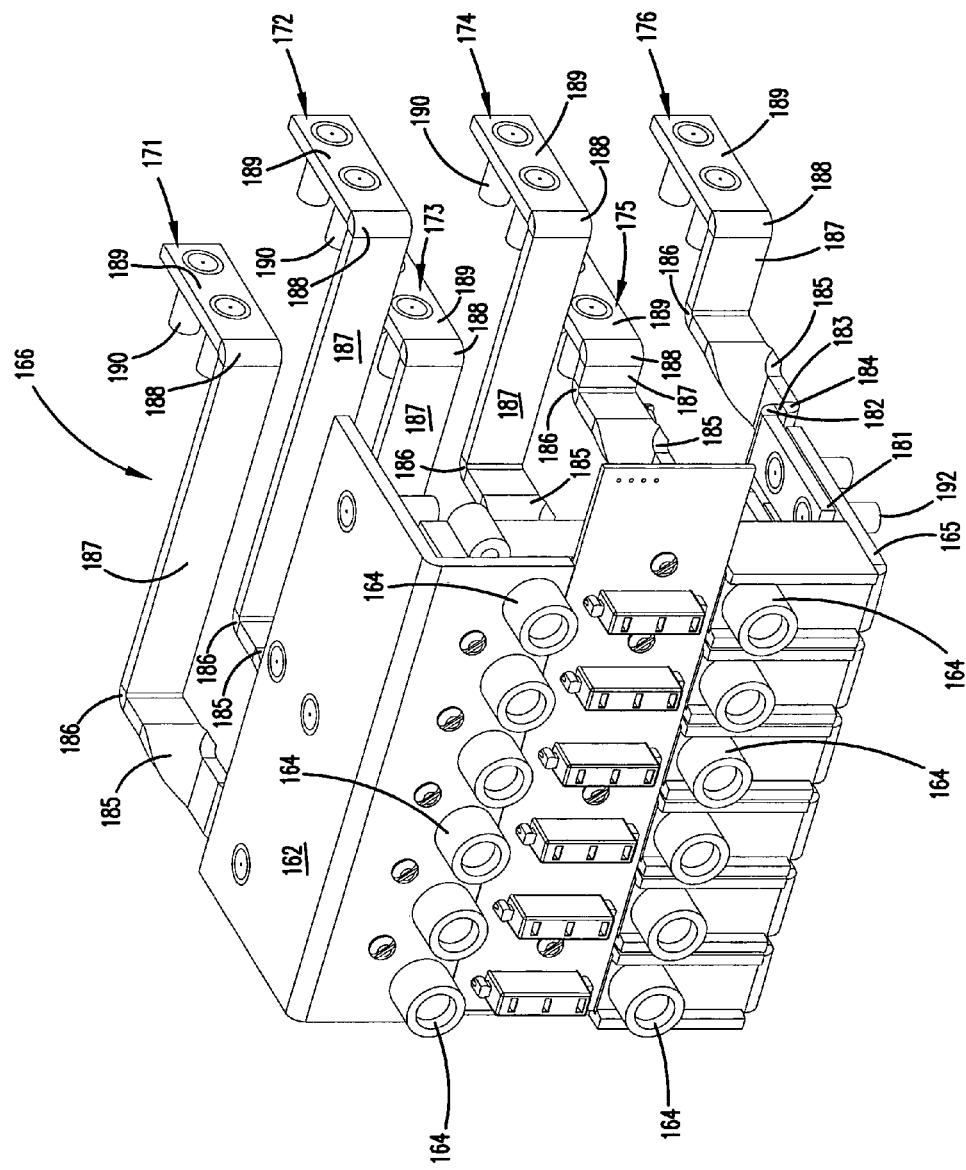
FIG. 27 is a front perspective view of a portion of the power distribution bus of FIG. 24.
Figure 28:
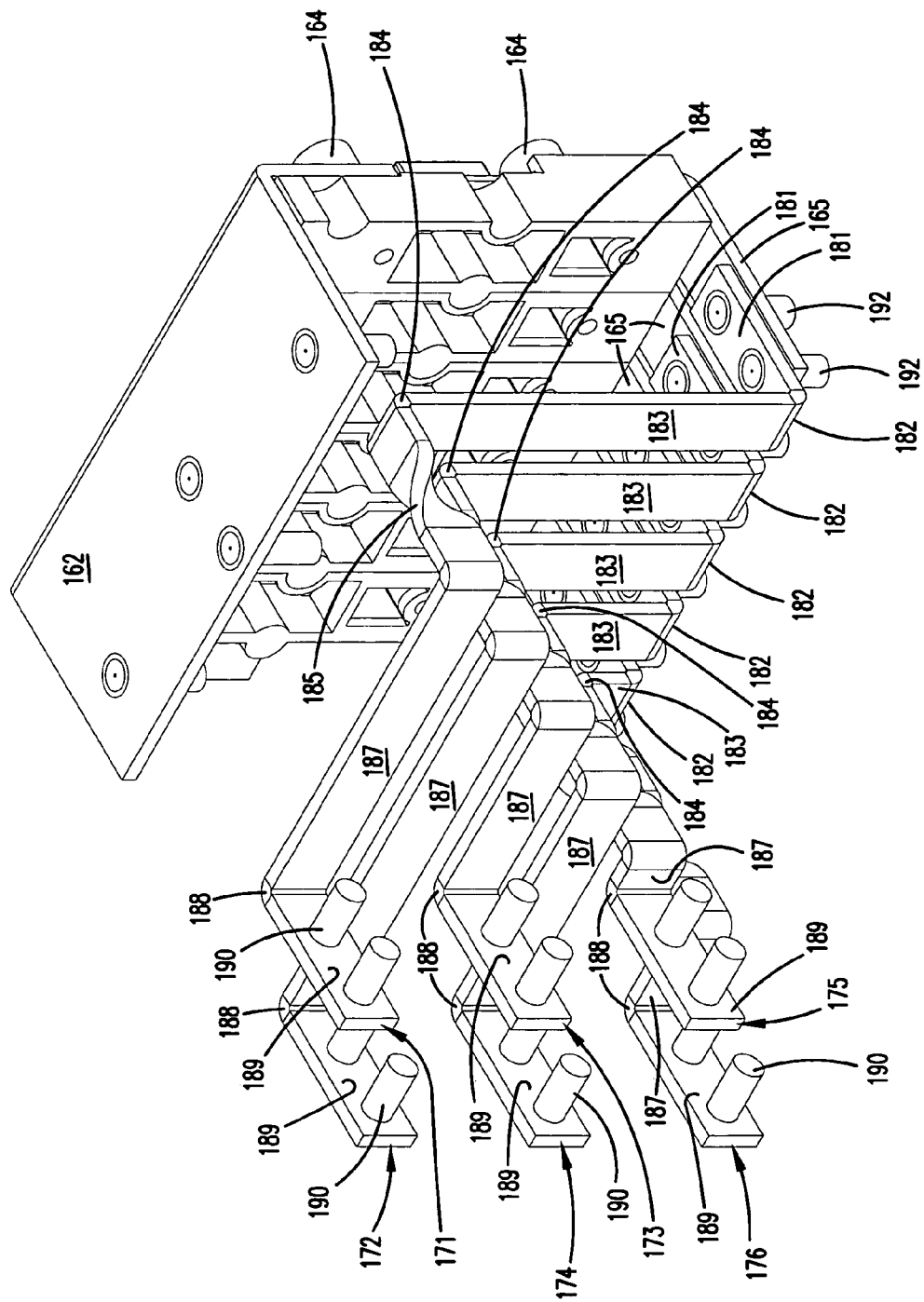
FIG. 28 is a rear perspective view of the portion of the power distribution bus of FIG. 26.
Figure 29:
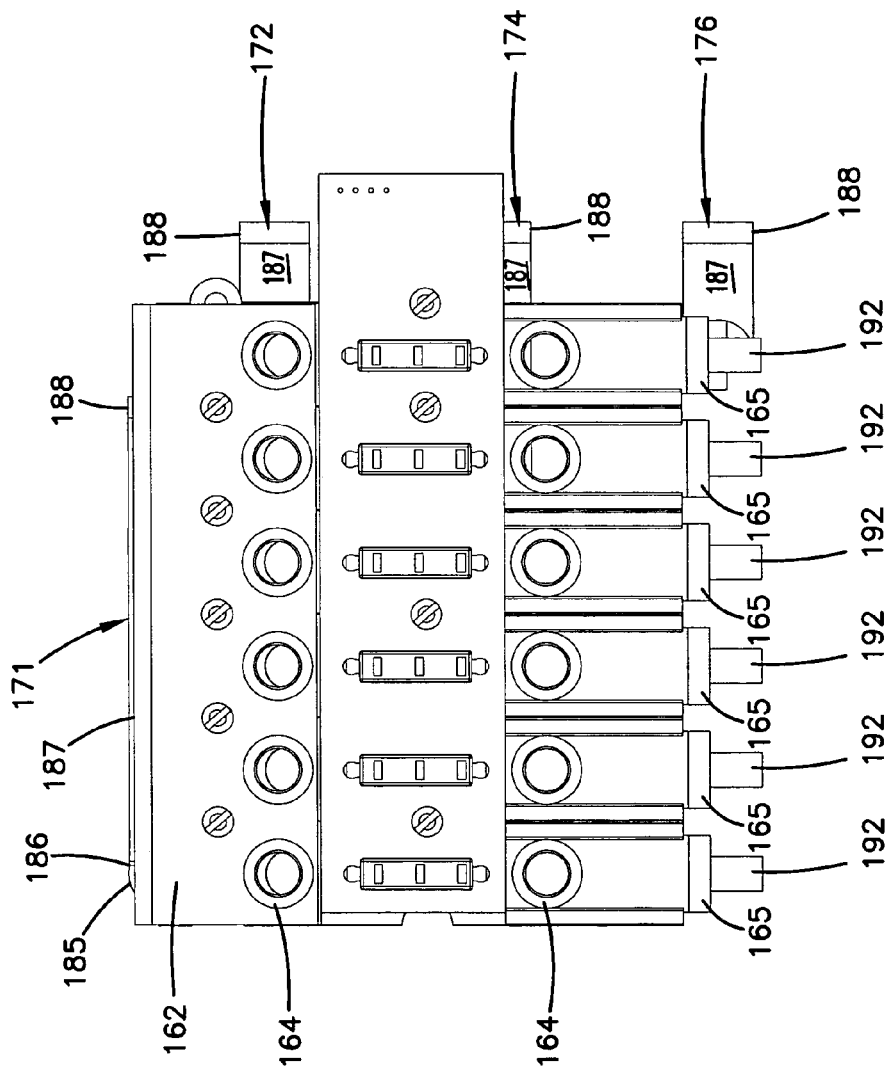
FIG. 29 is a front view of the portion of the power distribution bus of FIG. 26.
Figure 30:
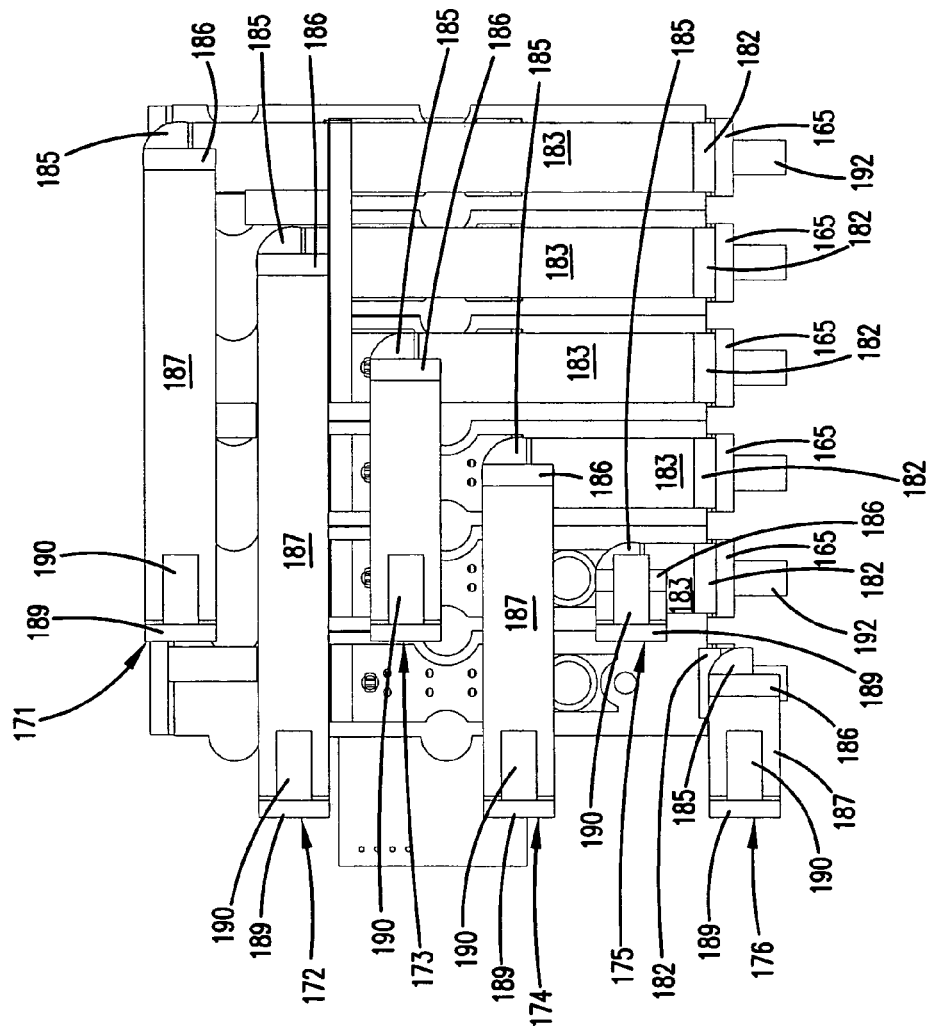
FIG. 30 is a rear view of the portion of the power distribution bus of FIG. 26.
Figure 31:
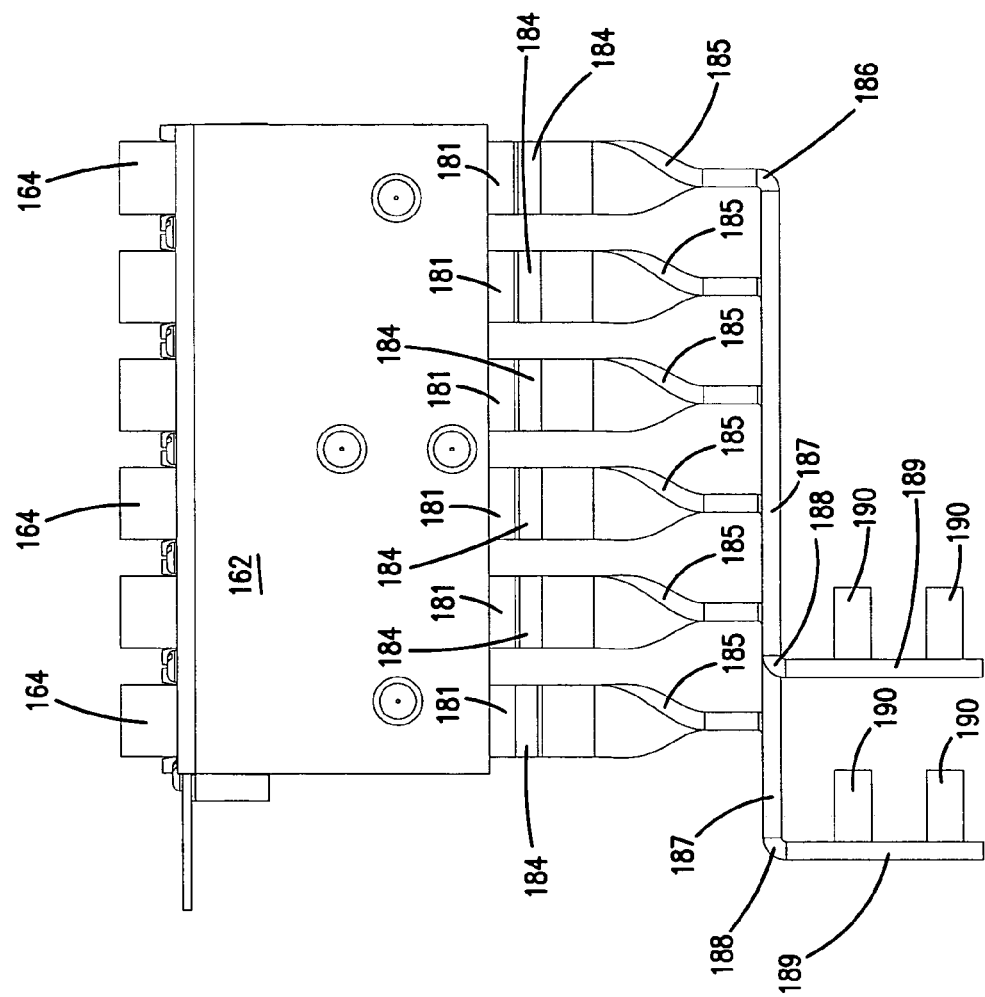
FIG. 31 is a top view of the portion of the power distribution bus of FIG. 26.
Figure 32:
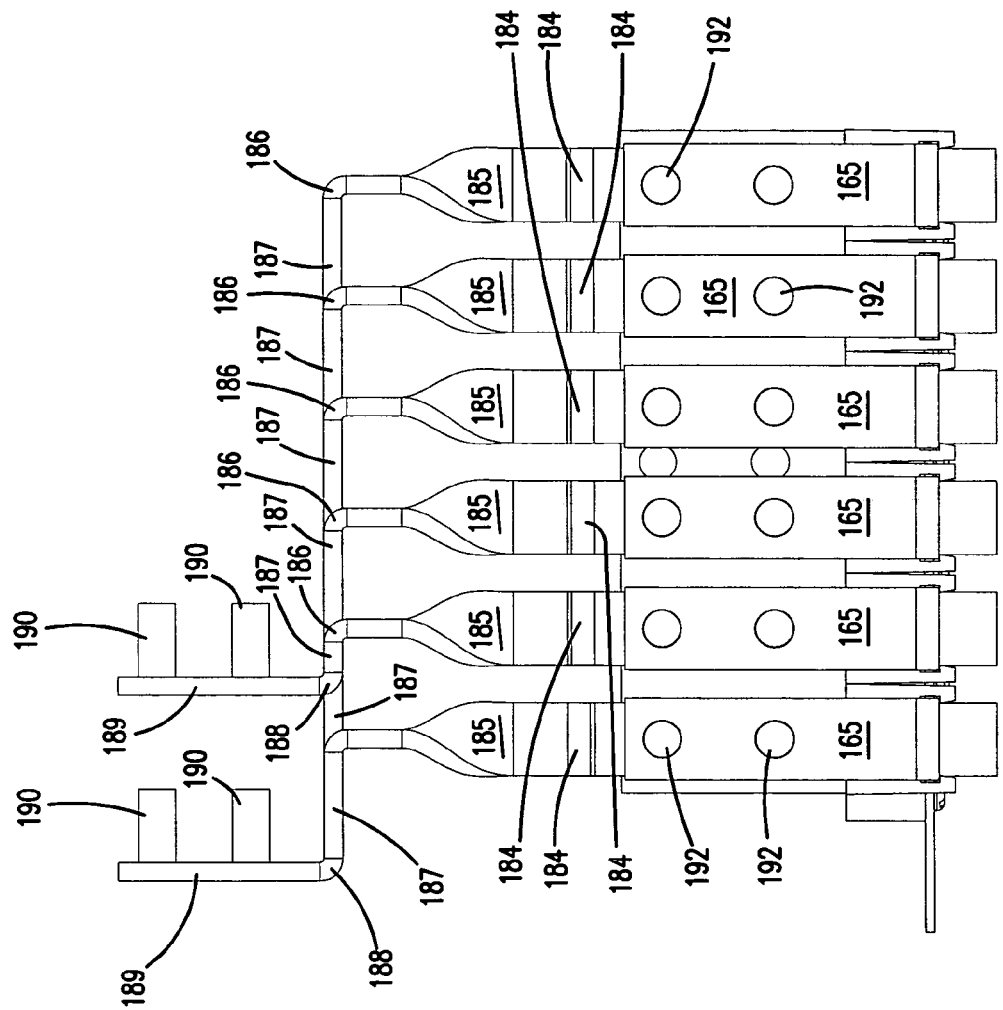
FIG. 32 is a bottom view of the portion of the power distribution bus of FIG. 26.

Referring now to FIGS. 24 through 26, an alternative power distribution bus 160 is shown. Bus 160 shown would be used in place of the right-side bus 60 in FIG. 4, above, and includes the same rear power input assembly 10 and rear power output assembly 12. Power conductor 42 is electrically connected with power bus end 56, which in turn feeds the power into a protective device mount 162. Protective device mount 162 permits protective devices such as circuit breakers 38 to be mounted in the electrical path. Leads 166 carry the power from protective device mount 162 to offset connectors 168 and 170 of power output assembly 12. Offset connectors 168 and 170 are configured to allow adjacent leads 166 to connect with rear output assembly 12 in staggered columns. Three offset connectors 168 are located in a first column and three offset connectors 170 are located in a second column. This offsetting of adjacent leads and power output connectors provides added space between the connections. This added space reduces the possibility of current in one lead inducing current in an adjacent lead in the area of the connection with power output assembly 12. Leads 166 as shown are crafted from bar stock. To reduce corrosion and other related occurrences, this bar stock may be plated with tin, lead or another suitable material.

Referring now to FIGS. 27 through 32, protective device mount 162 and leads 166 are shown with the other components of power distribution bus 160 removed. Leads 166 are individually numbered as leads 171 through 176, with lead 171 being the topmost lead and lead 176 being the bottommost lead. Leads 171, 173, and 175 are configured to connect with offset connectors 168 of power output assembly 12, while leads 172, 174 and 176 are configured to connect with offset connectors 170. Each of the leads is comprised of five sections, 181, 183, 185, 187 and 189, connected at four angles, 182, 184, 186 and 188. A connector section 181 of each lead 171 through 176 is electrically attached to protective device mount 162. An angle 182 then links connector segment 181 with a riser segment 183. An angle 184 in turn connects riser segment 183 with a twisted segment 185. An angle 186 connects twisted segment 185 with a transverse segment 187. An angle 188 connects transverse segment 187 with output connector segment 189. Posts 190 are mounted on output connector segments 189 to the electrical and physical contact between leads 166 and offset connectors 168 and 170. Posts 192 are mounted on connector segment 181 to improve electrical and physical contact between leads 166 and protective device mount 162.

Figure 33:
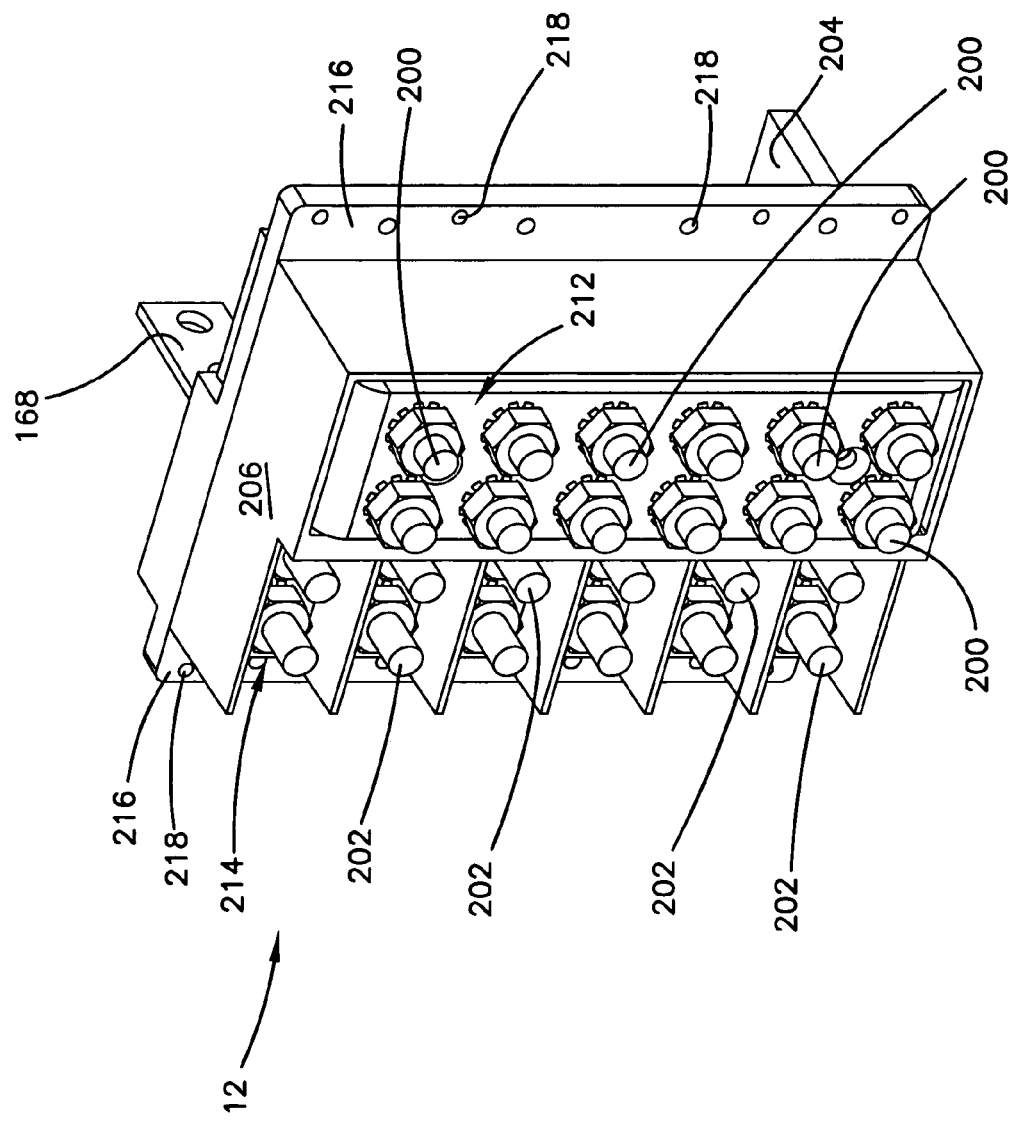
FIG. 33 is a rear perspective view of the power output assembly of FIG. 1.
Figure 34:
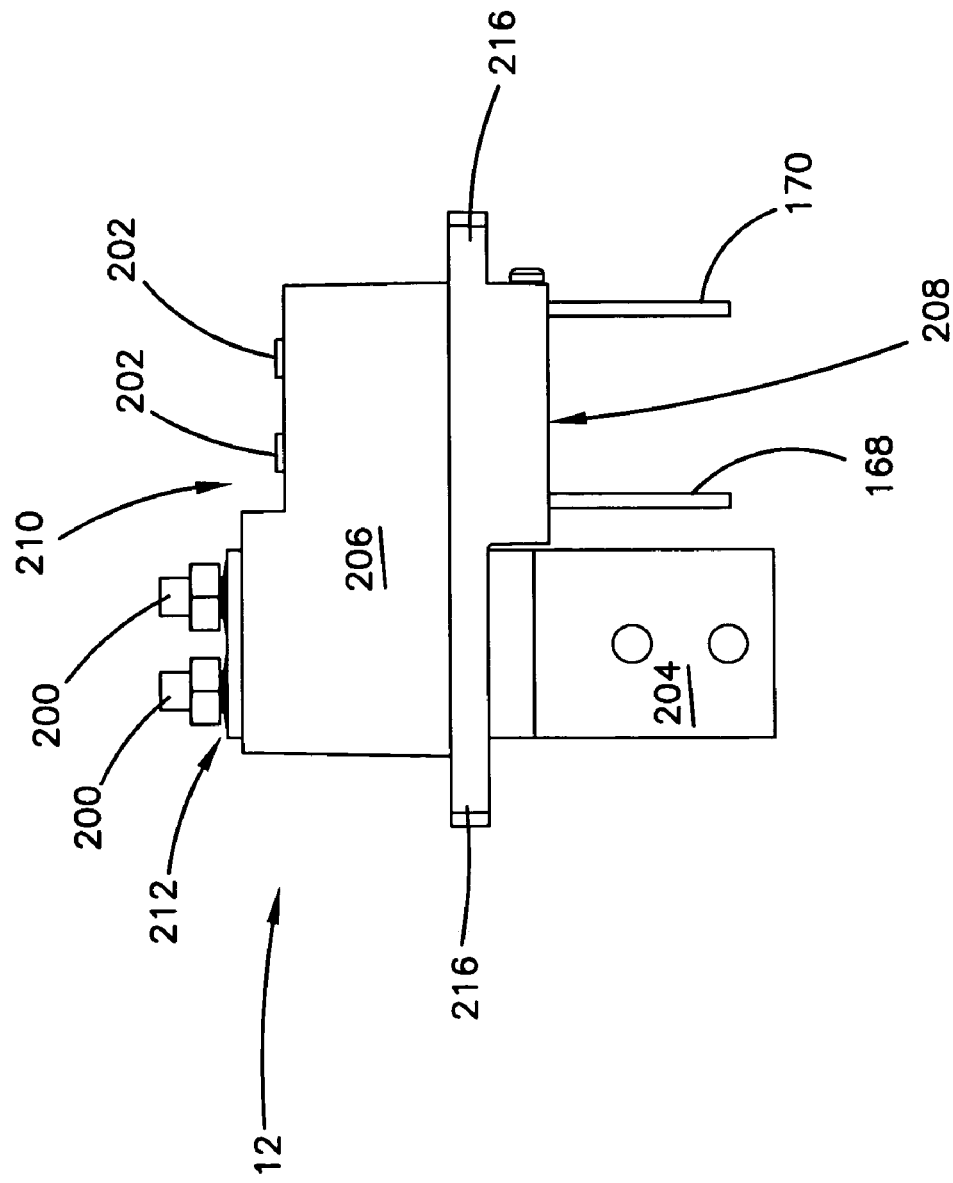
FIG. 34 is a top view of the power output assembly of FIG. 33.
Figure 35:
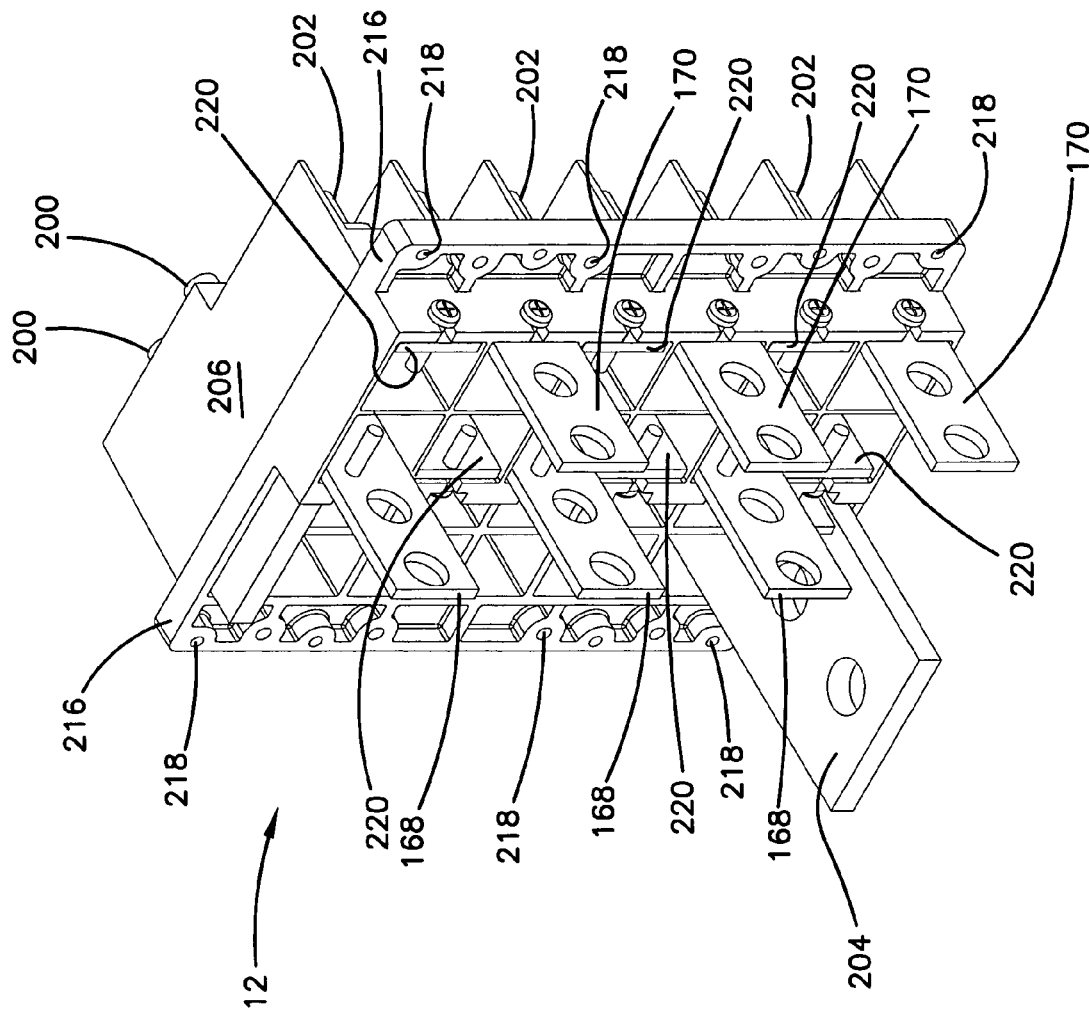
FIG. 35 is a front perspective view of the power output assembly of FIG. 33.

Referring now to FIGS. 33 through 35, output power assembly 12 is shown in greater detail, with leads 166 removed. Output power assembly 12 includes an output housing 206 with an inner face 208 and an outer face 210. Return terminals 200 and battery terminals 202 are in parallel columns on outer face 210 and located to different planes, 212 and 214, respectively, to provide separation and improved organization of battery and return cables from telecommunications equipment receiving power from panel 1.

As shown, output power assembly 12 is configured to supply power to six such devices, having six pairs of battery terminals 202 and six pairs of return terminals 200. Alternative configurations having more or fewer pairs of terminals can be used depending on size constraints and the number of devices requiring power. Output housing 206 is a uni-body housing, so that the same housing includes provisions for both battery and return terminals.

Terminals 200 and 202 are grouped in pairs to improve the quality and physical surface area of contact between the cables to and from the devices and the terminals, and to prevent rotation of the cables attached to the terminals. Return terminals 200 are all linked to a common return strap 204 which extends through output housing 206 from outer face 210 beyond inner face 208. When output power assembly 12 is mounted to panel 1, return strap 204 is electrically connected to return bus end 58.

Each pair of battery terminals 202 are connected to a conductor strap 220 which extends through output housing 206 from outer face 210 beyond inner face 208 and includes an offset connector 168 or 170. As detailed above, offset connectors 168 and 170 are electrically connected with segments 189 of leads 166 when output power assembly 12 is mounted to panel 1.

Flanges 216 and fastener openings 218 are provided on output housing 206 to allow power output assembly 12 to be securely and removably fastened to rear face 28 of panel 1, as shown in FIG. 1.

Having described preferred aspects and embodiments of the present invention, modifications and equivalents of the disclosed concepts may readily occur to one skilled in the art. However, it is intended that such modifications and equivalents be included within the scope of the claims which are appended hereto.

What is claimed is:

1. An electrical power distribution unit comprising:
   a plurality of output power terminals;
   a power distribution circuit corresponding to each of the output power terminals, each power distribution circuit including an opening configured to receive a protective device;
   a lead electrically connecting each power distribution circuit with the corresponding output power terminal;
   each output power terminal including an extension and each lead including a mating portion, each extension being in electrical contact with the mating portion of a lead;
   each extension and corresponding mating portion being laterally offset from each immediately adjacent extension and mating portion.

2. The electrical power distribution unit of claim 1, wherein the output power terminals are arranged in a generally vertical direction and the extensions and mating portions are horizontally offset from each in a staggered fashion, forming two generally parallel columns.

3. The electrical power distribution unit of claim 1, wherein the leads are comprised of bar stock of electrically conductive material.

4. The electrical power distribution unit of claim 1, wherein the leads are plated with a corrosion resistant material.

5. The electrical power distribution unit of claim 1, wherein the unit is mounted within a housing.

6. The electrical power distribution unit of claim 1, wherein the extensions and the corresponding mating portions being parallel with and adjacent to each other, with each extension and corresponding mating portion.

7. The electrical power distribution unit of claim 1, wherein the opening configured to receive a protective device is configured to receive a circuit breaker.

8. The electrical power distribution unit of claim 1, wherein the opening configured to receive a protective device is provided on a protective device mount.

9. An electrical power distribution unit comprising:
   a plurality of output power terminals;
   a plurality of power distribution circuits, each of the power distribution circuits corresponding to at least one of the output power terminals;
   a lead electrically connecting each power distribution circuit with the corresponding output power terminal, the lead including:
      a first portion configured to interface with the corresponding power distribution circuit; and
      a second portion configured to interface with the corresponding output power terminal;
   wherein the second portion of each lead is parallel to but offset in a first direction from the second portion of each adjacent lead, and
   wherein the power distribution circuits define a plane extending substantially parallel to the first direction, the power distribution circuits being spaced apart along the plane.

10. The electrical power distribution unit of claim 9, wherein each lead further comprises a third portion electrically connecting the first portion and the second portion, the third portion extending in the first direction forming a non-parallel angle with the first portion, the leads positioned adjacent one another such that the third portions of the leads are offset from each other in a second direction perpendicular to the first direction.

11. The electrical power distribution unit of claim 9, wherein the leads are comprised of bar stock of electrically conductive material.

12. The electrical power distribution unit of claim 9, wherein the leads are plated with a corrosion resistant material.

13. The electrical power distribution unit of claim 9, wherein the unit is mounted within a housing.

14. The electrical power distribution unit of claim 9, wherein the first direction is horizontal and the second direction is vertical.

15. The electrical power distribution unit of claim 9, wherein the angle formed between the first portion and the third portion is substantially ninety degrees and the angle formed between the third portion and the second portion is substantially ninety degrees.

* * * * *